United States Patent
Schmenn et al.

(10) Patent No.: US 9,911,822 B2
(45) Date of Patent: Mar. 6, 2018

(54) METHOD FOR MANUFACTURING VERTICALLY INTEGRATED SEMICONDUCTOR DEVICE

(71) Applicant: Infineon Technologies AG, Neubiberg (DE)

(72) Inventors: Andre Schmenn, Sachsenkam (DE); Damian Sojka, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/336,847

(22) Filed: Oct. 28, 2016

(65) Prior Publication Data

US 2017/0047423 A1     Feb. 16, 2017

Related U.S. Application Data

(63) Continuation of application No. 14/552,567, filed on Nov. 25, 2014, now Pat. No. 9,515,177.

(51) Int. Cl.
| | | |
|---|---|---|
| H01L 21/00 | (2006.01) | |
| H01L 27/02 | (2006.01) | |
| H01L 29/66 | (2006.01) | |
| H01L 29/74 | (2006.01) | |
| H01L 21/285 | (2006.01) | |

(52) U.S. Cl.
CPC .... H01L 29/66371 (2013.01); H01L 27/0251 (2013.01); H01L 27/0262 (2013.01); H01L 29/7412 (2013.01); H01L 21/28562 (2013.01)

(58) Field of Classification Search
CPC ........... H01L 21/28562; H01L 21/2815; H01L 21/76897; H01L 27/0262; H01L 27/0251; H01L 27/0629; H01L 27/0688; H01L 29/7412; H01L 29/66371; H01L 29/0692
See application file for complete search history.

(56) References Cited

U.S. PATENT DOCUMENTS

| | | | |
|---|---|---|---|
| 5,828,101 A | 10/1998 | Endo | |
| 7,816,257 B2* | 10/2010 | Cheong | H01L 21/28562 438/637 |
| 8,026,504 B2* | 9/2011 | Park | H01L 27/24 257/24 |
| 2006/0246710 A1* | 11/2006 | Cheong | H01L 21/28562 438/618 |
| 2008/0272434 A1* | 11/2008 | Park | H01L 27/115 257/347 |
| 2009/0218558 A1* | 9/2009 | Park | H01L 27/24 257/4 |

FOREIGN PATENT DOCUMENTS

| | | |
|---|---|---|
| JP | 2007529115 A | 10/2007 |
| KR | 100244671 B1 | 2/2000 |
| KR | 20040023477 A | 3/2004 |
| WO | 2005065385 A2 | 7/2005 |

* cited by examiner

*Primary Examiner* — Nikolay Yushin
(74) *Attorney, Agent, or Firm* — Viering, Jentschura & Partner mbB

(57) ABSTRACT

A vertically integrated semiconductor device in accordance with various embodiments may include: a first semiconducting layer; a second semiconducting layer disposed over the first semiconducting layer; a third semiconducting layer disposed over the second semiconducting layer; and an electrical bypass coupled between the first semiconducting layer and the second semiconducting layer.

18 Claims, 17 Drawing Sheets

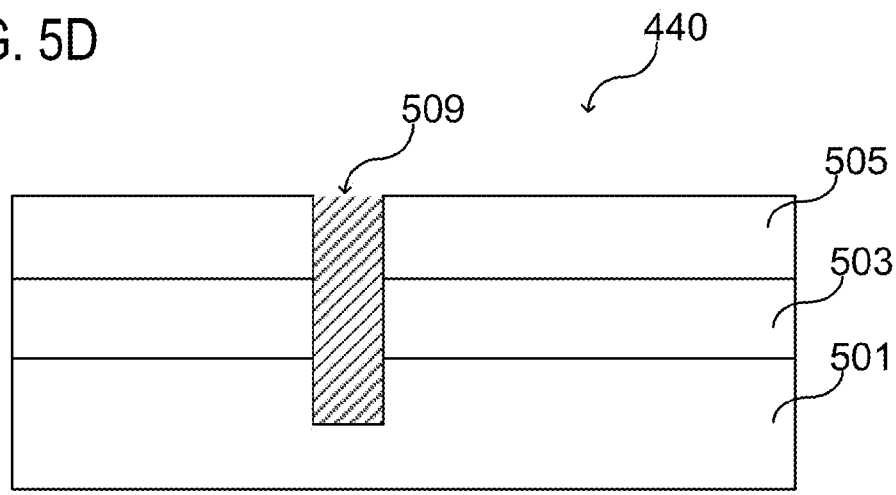
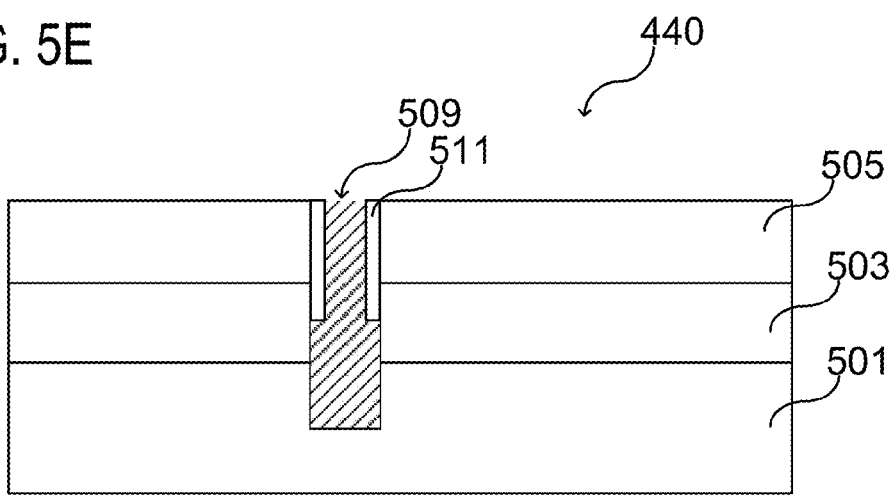
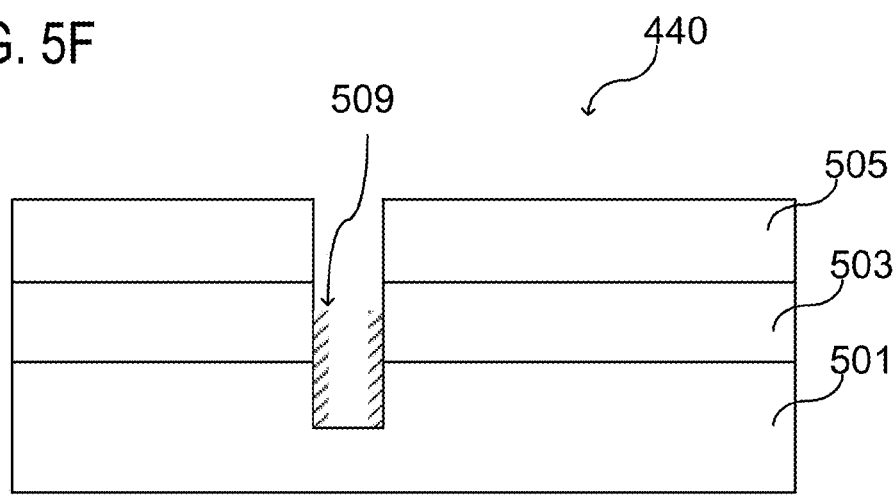

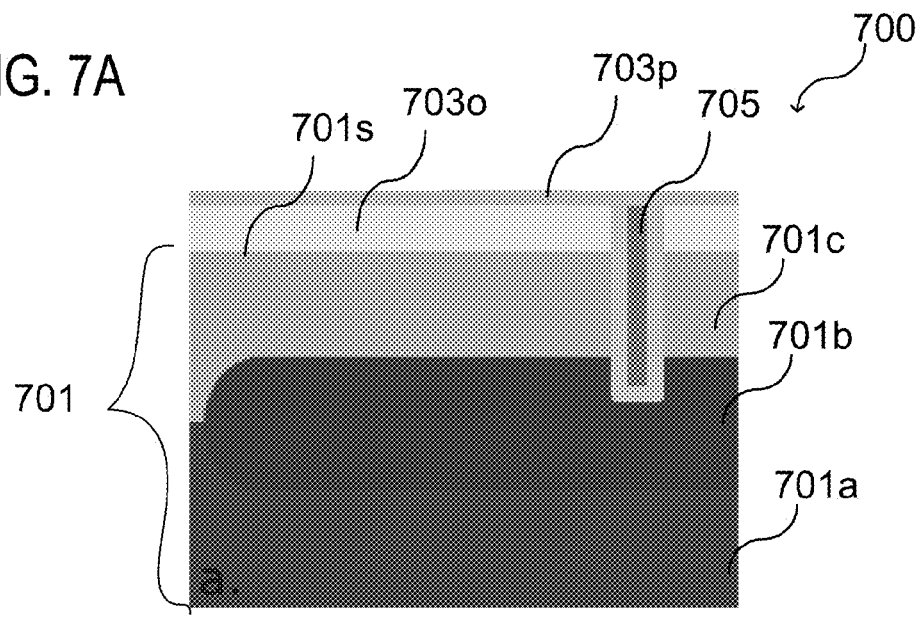
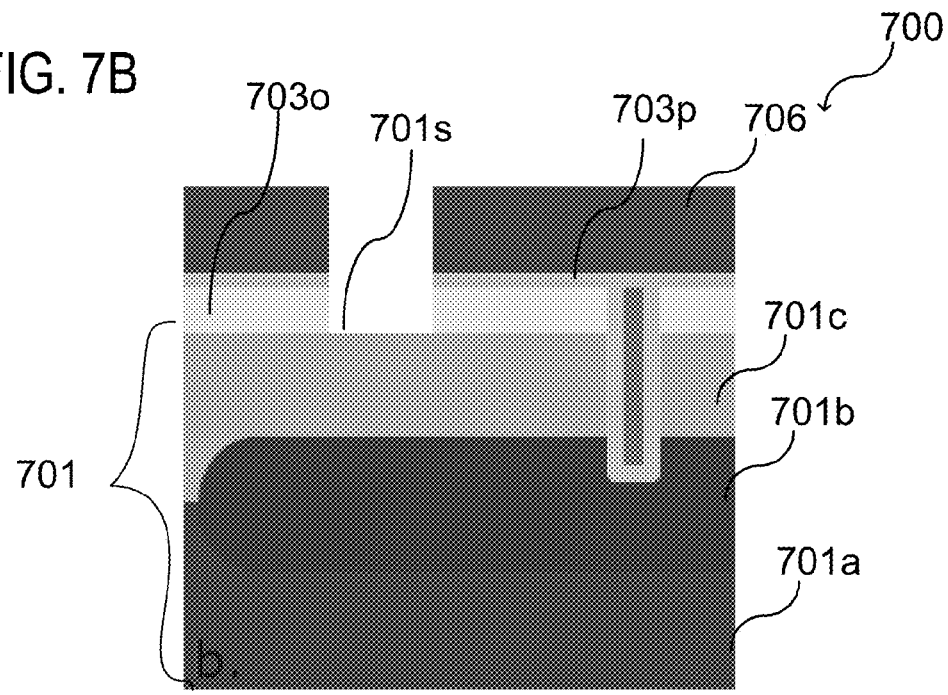

METHOD FOR MANUFACTURING VERTICALLY INTEGRATED SEMICONDUCTOR DEVICE

RELATED APPLICATION(S)

This application is a continuation of U.S. patent application Ser. No. 14/552,567, filed Nov. 25, 2014, entitled, "VERTICALLY INTEGRATED SEMICONDUCTOR DEVICE AND MANUFACTURING METHOD", the contents of which are incorporated herein by reference.

TECHNICAL FIELD

Various embodiments relate to a vertically integrated semiconductor device and to a method of manufacturing a vertically integrated semiconductor device.

BACKGROUND

Protection devices may be needed in semiconductor technology to provide protection against electrostatic discharge (ESD). Among currently used protection devices, thyristors may have beneficial characteristics. ESD concepts based on laterally integrated devices as well as concepts based on vertically integrated devices are currently used in the art. Vertically integrated devices may have certain advantages compared to laterally integrated devices. However, vertically integrated devices may be manufactured by forming one or more layers above each other, the one or more layers including semiconductor material, e.g. doped or undoped semiconductor material, e.g. doped or undoped silicon.

SUMMARY

In accordance with various embodiments, a vertically integrated semiconductor device may include: a first semiconducting layer; a second semiconducting layer disposed over the first semiconducting layer; a third semiconducting layer disposed over the second semiconducting layer; and an electrical bypass coupled between the first semiconducting layer and the second semiconducting layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 5A to 5F show a vertically integrated semiconductor device during processing respectively in a schematic cross-sectional view according to various embodiments;

FIGS. 7A to 7H show a semiconductor device during processing respectively in a schematic cross-sectional view, according to various embodiments;

DESCRIPTION

Figure 1:
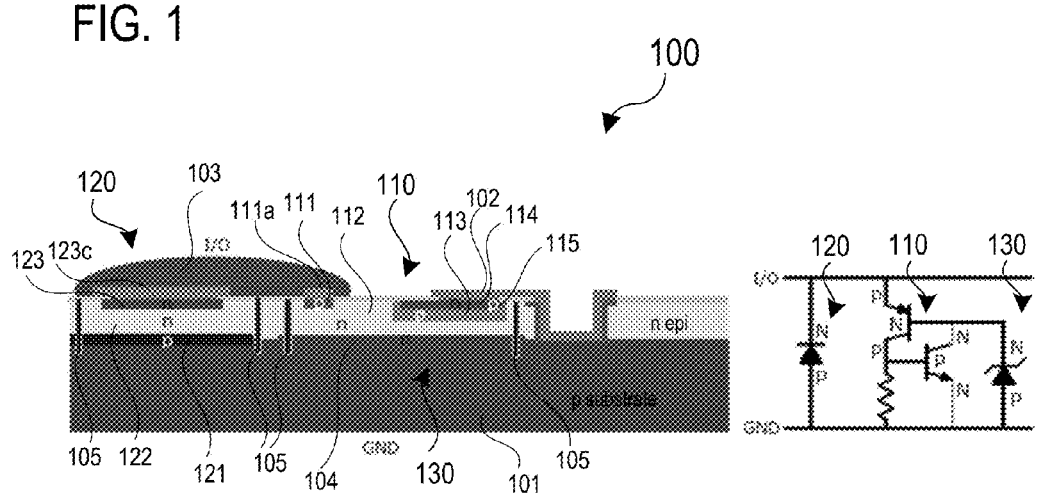
FIG. 1 shows a currently available ESD protection device including a thyristor and a bypass diode.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc. The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" extension of a structure (or of a structure element) provided at least one of on or in a carrier (e.g. a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer. Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

Various embodiments provide a vertically integrated semiconductor device having an electrical bypass path (also referred to as electrical bypass or electrical short). In some embodiments, the electrical bypass path may bypass a pn-junction, wherein the pn-junction may be provided by a p-type doped semiconducting layer formed over an n-type doped semiconducting layer, or, alternatively, by an n-type doped semiconducting layer formed over a p-type doped semiconducting layer. The semiconducting layers may be formed over a carrier (e.g. over a wafer) or over another layer, e.g. over another semiconducting layer or over a metal layer. Further, the pn-junction may be provided by a p-type doped semiconducting layer formed over an n-type doped semiconducting carrier (e.g. an n-type doped wafer), or, alternatively, by an n-type doped semiconducting layer formed over a p-type doped semiconducting carrier (e.g. formed over a p-type doped carrier).

The electrical bypass path may be provided by a metal or metal alloy, wherein the metal or metal alloy may be in contact with the semiconducting layers to be bypassed, or the electrical bypass path may be a heavily doped semiconductor material acting as electrical conductor. According to various embodiments, a pn-junction may be bypassed by a metal or metal alloy or any other metallic material. The metal may provide an ohmic contact with the one or more semiconducting layers and/or with the semiconducting carrier. According to various embodiments, carbon, titanium, tungsten, germanium, nickel, cobalt, iron, ruthenium, rhodium, platinum, iridium, copper, gold, silver, tantalum, titanium nitride, e.g. deposited by chemical vapor deposition (CVD) and/or a physical vapor deposition (PVD), may be used for bypassing a pn-junction.

According to various embodiments, a semiconducting layer may be also referred to as semiconductor layer. Further, semiconducting material may be also referred to as semiconductor material and a semiconducting carrier may be also referred to as semiconductor carrier.

According to various embodiments, a semiconductor carrier (e.g. a semiconductor substrate, a semiconductor wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example, semiconductor compound material such as gallium arsenide (GaAs), indium phosphide (InP), but also any suitable ternary semiconductor compound material or quaternary semiconductor compound material such as indium gallium arsenide (InGaAs).

Various embodiments provide an ESD protection element which may be very robust. In accordance with various embodiments, the ESD protection is based on a vertical thyristor concept. Various embodiments provide a thyristor having a high holding current and a low forward resistance. This may be achieved, for example, by providing an electrical short, e.g. a metal, in at least one pn-junction of the thyristor. According to various embodiments, the thyristor circuit of an ESD protection may be provided as vertical semiconductor device, wherein the pn-junctions of the thyristor may be provided by a plurality of layers including respectively doped semiconducting material. According to various embodiments, the pn-junction of the thyristor may be buried below a surface of a carrier and the electrical bypass (also referred to as electrical short) may be provided by a trench, the trench formed from the surface of the carrier into the carrier and filled with a metal, the metal bypassing the pn-junction. According to various embodiments, bypassing a pn-junction may include at least bypassing the depletion zone which is generated by oppositely doped semiconducting layers or oppositely doped semiconducting regions.

In accordance with various embodiments, the holding current of the thyristor after its triggering, e.g. breakdown, is relatively high so that a latch-up may be prevented. The holding current may be adjusted via the resistance at the p/n base of the thyristor. Due to the high holding current, it may be prevented that a system to be protected provides a current which is necessary to remain in latch-up condition, so that the thyristor enters the blocking state (off state) again immediately after an ESD event.

Due to systems becoming ever more sensitive, such as interfaces high speed data transmission lines (e.g. USB 3.1, USB 3.0, Thunderbolt, HDMI, or the like), there is a need to provide protection elements against electrostatic discharges, so-called ESD protection. To this end, the protection element may permit only a very low overvoltage. This may be achieved by a low dynamic inherent resistance and voltage snapback (snapback, negative resistance).

One of the ESD concepts currently available in silicon technology relies on a lateral thyristor having a vertical bypass diode. FIG. 1 shows a cross-sectional view (left side) and an equivalent circuit (right side) of a currently available ESD protection element 100 in silicon technology including a lateral thyristor 110 (e.g. a lateral pnpn-thyristor 110) and a vertical bypass diode 120 (e.g. a vertical np diode 120 coupled in parallel to the lateral thyristor 110). The lateral thyristor 110 and the vertical bypass diode 120 may be formed in and/or on a p-type substrate 101. The lateral thyristor 110 may include three pn-junctions (e.g. pn-np-pn). As illustrated in FIG. 1, the lateral thyristor 110 may include a p-type region 111 (also referred to as anode region) which may be electrically contacted by a first electrode 111a of the lateral thyristor 110, an n-type region 112 which may serve as a base region of lateral thyristor 110, a p-type region 113 which may serve as another base region of lateral thyristor 110, and an n-type region 114 (also referred to as cathode region) which may be electrically contacted by a second contact 102 of the lateral thyristor 110. The second contact 102 of the lateral thyristor 110 may be connected to a ground (GND) potential and/or may provide a ground (GND) potential to the p-type substrate 101.

Further, the vertical bypass diode 120 may include a p-type region 121 (also referred to as anode region) and an n-type region 122 (also referred to as cathode region) which may form the pn-junction of the vertical bypass diode 120. The vertical bypass diode 120 may be connected to a first electrode 123c of the vertical bypass diode 120 via a further n-type region 123 (the further n-type region 123 may be more highly doped than the n-type region 122) and to ground (GND) potential via the p-type substrate 101, e.g. to the same contact 102 as connected to the n-type region 114 of the lateral thyristor 110.

As already described, the ground (GND) potential may be applied to substrate 101 via an electrical contact 102 (also referred to as electrode). The ground (GND) potential may be applied to the n-type region 114 of the lateral thyristor 110. Further, the ground (GND) potential may be applied to the p-type region 113 of the lateral thyristor 110 via a further p-type region 115 (the further p-type region 115 may be more highly doped than the p-type region 113). An input/output (I/O) contact 103 may be coupled to p-type region 111 of the lateral thyristor 110 and to the further n-type region 123 of the vertical bypass diode 120. In other words, the two electrodes 123c and 111a (e.g. the cathode 123c of the vertical bypass diode 120 and the anode 111a of the lateral thyristor 110) may be coupled to the very same input/output (I/O) contact 103. Hence, the vertical bypass diode 120 may be coupled in parallel to the lateral thyristor 110 between input/output (I/O) and ground (GND), as illustrated in the equivalent circuit.

The ESD protection element 100 may further include an n-type region 104 disposed between n-type region 112 and p-type substrate 101. The n-type region 104 disposed between n-type region 112 and p-type substrate 101 and the p-type substrate 101 may form a Zener diode 130 coupled between ground potential (GND) and n-type region 112 of the lateral thyristor 110.

Further, the n-type region 112 of the lateral thyristor 110 and n-type region 122 of the vertical bypass diode 120 may be part of an epitaxially grown layer or may be provided by an epitaxially grown n-type doped layer, e.g. an n-type doped silicon layer. Therefore, the lateral thyristor 110 and the vertical bypass diode 120 may be electrically separated from each other by isolation trenches 105. The n-type regions 104, 113, and 123 may have a higher dopant concentration than the n-type regions 112 and 122. The p-type regions 111, 115, and 121 may have a higher dopant concentration than the p-type substrate 101 and the p-type region 113.

The semiconductor material respectively contacting the electrodes 123c, 111a may be highly doped to avoid a formation of a Schottky contact from the electrodes 123c, 111a and the semiconductor material, e.g. further n-type region 123 of the vertical bypass diode 120 may form an ohmic contact with the electrode 123c and/or further p-type region 115 of the lateral thyristor 110 may form an ohmic contact with the contact 102.

The configuration shown in FIG. 1 may have one or more of the following drawbacks: the dynamic resistance and ESD robustness may be limited compared to an ESD protection element based on a vertical thyristor; the switching time may be longer compared to an ESD protection element based on a vertical thyristor. A lateral device may consume a greater area of a wafer or die compared to a vertical device. In other words, a lateral device may require a greater active area in the wafer or die compared to a vertical device.

Figure 2:
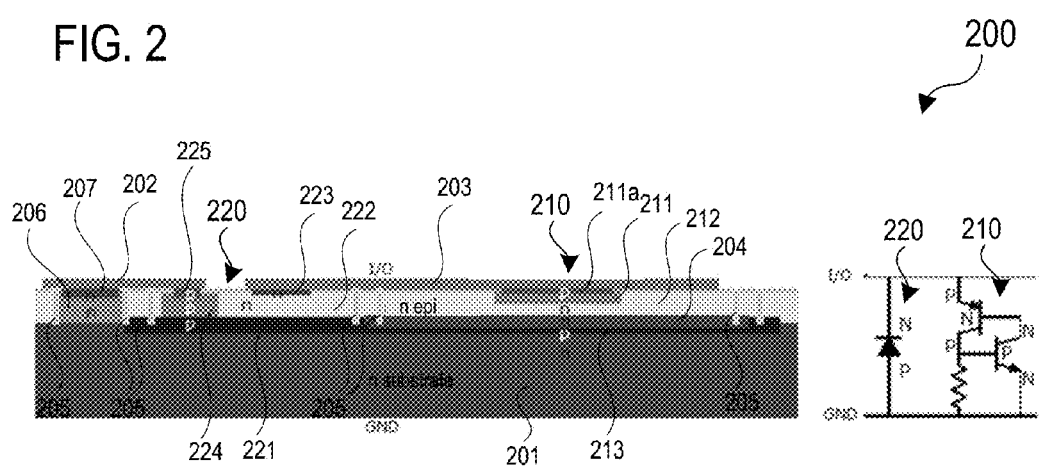
FIG. 2 shows a currently available ESD protection device including a thyristor and a bypass diode.

Another ESD concept currently available relies on a vertical thyristor, in which the bypass diode is connected laterally to the front side again, as, for example, shown in FIG. 2. FIG. 2 shows a cross-sectional view (left side) and an equivalent circuit (right side) of an ESD protection element 200 including a vertical thyristor 210 and a bypass diode 220. The bypass diode 220 may include a p-type region 221 (also referred to as anode region) and an n-type region 222 (also referred to as cathode region) which may form a pn-junction of the bypass diode 220. The bypass diode 220 may be connected to a first contact 203, or, in other words, to an input/output (I/O) contact 203, of the ESD protection element 200, via a further n-type region 223 (the further n-type region 223 may be higher doped than the n-type region 222). The bypass diode 220, e.g. the p-type region 221 of the bypass diode 220, may be connected (e.g. laterally) to the front side of the ESD protection element 200 again via one or more additional p-type regions so that the bypass diode 220 may be connected to ground (GND) potential applied, for example, at a second contact 202 of the ESD protection element 200.

As illustrated in FIG. 2, the bypass diode 220 and the vertical thyristor 210 may be formed in and/or on an n-type substrate 201. The n-type substrate 201 may be connected to the second contact 202 of the ESD protection element 200, e.g. to ground (GND) potential, by additional n-type regions 206, 207.

Further, the vertical thyristor 210 of the ESD protection element 200 may include three pn-junctions (e.g. pn-np-pn). As illustrated in FIG. 2, the vertical thyristor 210 may include a p-type region 211 (also referred to as anode region) which may be electrically connected to the first contact 203 by a further p-type region 211a (the further p-type region 211a may be higher doped than the p-type region 211). Further, the n-type substrate 201 may provide an n-type region 201 of the vertical thyristor 210. The vertical thyristor 210 may further include an n-type region 212 which may serve as a base region of vertical thyristor 210 and a p-type region 213 which may serve as another base region of vertical thyristor 210. The vertical thyristor 210 may include a further n-type region 204; the further n-type region 204 may be higher doped than the n-type region 212.

The configuration shown in FIG. 2 may have one or more of the following drawbacks: the ESD protection element 200 may have a high resistance in forward direction due to connecting the bypass diode 220 from the front side; and the thyristor may have a high base resistance which may cause a low holding current.

Further, the n-type region 211 of the vertical thyristor 210 and n-type region 222 of the vertical bypass diode 220 may be part of an epitaxially grown layer or may be provided by an epitaxially grown n-type doped layer, e.g. by an n-type doped silicon layer. Therefore, the vertical thyristor 210 and the vertical bypass diode 220 may be electrically separated from each other by isolation trenches 205. The n-type regions 204, 223, and 207 may have a higher dopant concentration than the n-type regions 212 and 222. The p-type regions 211a, 225 may have a higher dopant concentration than the p-type region 211, 224.

According to various embodiments, the semiconductor material that is in direct contact with the contacts 202, 203 may be highly doped to avoid a formation of a Schottky-barrier or Schottky-contact.

In general, as illustrated in FIGS. 1 and 2, an ESD protection element 100, 200 currently available may require an additional metallization at the front side for the bypass diode or for the thyristor to operate the ESD protection element 100, 200.

Various embodiments provide a thyristor-based ESD protection element having a buried pn-short. The term "pn-short" may include or may refer to a low-ohmic connection between a p-type conductivity region (e.g. a p-doped region) and an n-type conductivity region (e.g. an n-doped region), bypassing a pn-junction between the p-doped region and the n-doped region. A low base resistance as well as a low bypass diode resistance may be achieved by means of the pn-short.

According to various embodiments, a resistance for adjusting a holding current in a vertical thyristor concept may be buried underneath an epitaxial layer while an additional diode may be coupled in parallel. In accordance with various embodiments, a pn-junction of this diode may be bypassed. In accordance with some embodiments, this bypass may be realized by at least one trench that is filled with a material having very low (or virtually no compared to the used semiconductor material) electrical resistance (e.g. a metal). In accordance with some embodiments, the pn-junction may be bypassed by means of a metal plug.

Figure 3A:
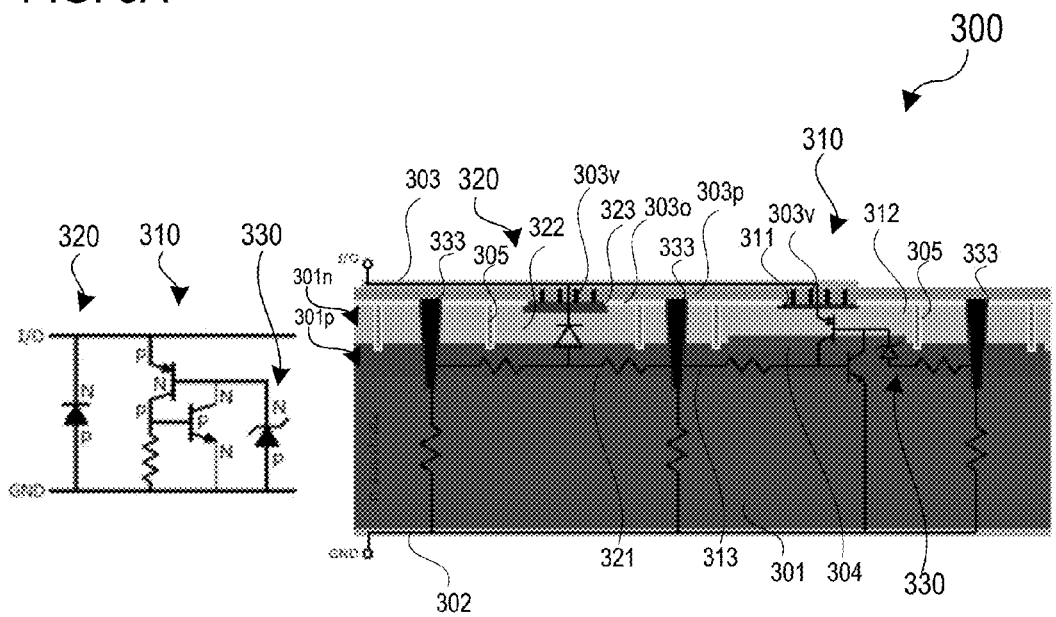
FIGS. 3A and 3B show respectively an ESD protection device and an equivalent circuit in a schematic view according to various embodiments.
Figure 3B:
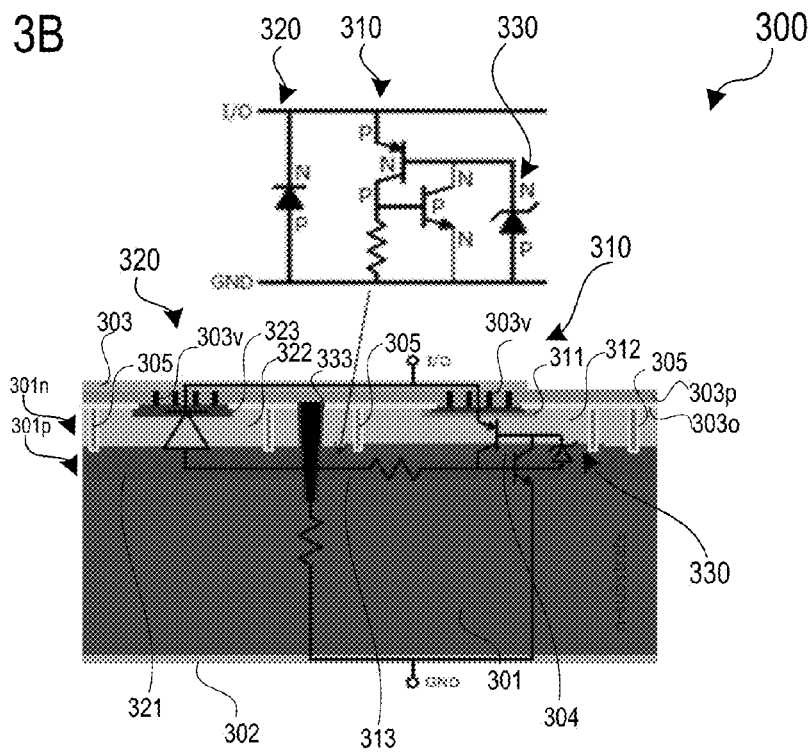

FIG. 3A and FIG. 3B show respectively a cross-sectional view (right side) and an equivalent circuit (left side) of an ESD protection element 300 including a vertical thyristor 310 and a vertical bypass diode 320 according to various embodiments. The equivalent circuit is superposed with the cross-sectional view for illustrating the components provided by accordingly configured regions of the ESD protection element 300. The ESD protection element 300 may include at least one pn-short, e.g. at least one pn-short in a pn-junction of the vertical thyristor 310 and at least one pn-short in a pn-junction below the vertical bypass diode 320. According to various embodiments, both, the vertical thyristor 310 and the vertical bypass diode 320 may be provided by an n-type semiconducting substrate 301 and an n-type semiconducting layer 301n formed over the n-type semiconducting substrate 301, e.g. by an epitaxially grown n-type doped silicon layer 301n formed over an n-type silicon substrate 301. However, the vertical thyristor 310 and the vertical bypass diode 320 may be provided in any other suitable semiconductor material. The ESD protection element 300 may include a p-type semiconducting layer 301p (e.g. formed by ion implantation or any other suitable doping technology or by depositing an epitaxial p-type semiconducting layer 301p) between the n-type semiconducting layer 301n and the n-type semiconducting substrate 301. Further, the ESD protection element 300 may include a first contact 303 (e.g. a first contact pad 303, e.g. an input/output (I/O) terminal 303) at the front side of the ESD protection element 300 (the first contact 303 facing for example the n-type semiconducting layer 301n) and a second contact 302 (e.g. a second contact pad 302), e.g. for applying ground (GND) potential, at the back side of the ESD protection element 300, e.g. facing the n-type semiconducting substrate 301. The second contact 302 may be a back side contact pad or may be part of a back side metallization, e.g. in direct contact with the n-type semiconducting substrate 301. The first contact 303 may be a front side contact pad or may be part of a front side metallization, wherein an electrically insulating layer or an electrically insulating layer stack may be provided between the first contact 303 and the n-type semiconducting layer 301n. As illustrated in FIG. 3, an oxide layer 303o (or any other suitable electrically insulating layer) and a passivation layer 303p (e.g. including an electrically insulating glass or any other electrically insulating material) may be formed between the n-type semiconducting layer 301n and the first contact 303.

According to various embodiments, the vertical bypass diode 320 may include a p-type region 321 and an n-type region 322 which may form a pn-junction of the vertical bypass diode 320. The vertical bypass diode 320 may be connected to the first contact 303, or, in other words, to the input/output (I/O) contact 303, of the ESD protection element 300, via a further n-type region 323 (the further n-type region 323 may be higher doped than the n-type region 322). The n-type region 322 of the vertical bypass diode 320 may be electrically connected to the first contact 303 by one or more electrodes 303v extending through the electrically insulating layer or layer stack (e.g. through the oxide layer 303o and through the passivation layer 303p) provided between the n-type semiconducting layer 301n and the first contact 303. The further n-type region 323 of the vertical bypass diode 320 and the one or more electrodes 303v contacting the further n-type region 323 may be configured to form one or more ohmic contacts.

The vertical bypass diode 320, e.g. the p-type region 321 of the vertical bypass diode 320, may be connected (e.g. vertically, e.g. through the n-type semiconducting substrate 301) to the back side of the ESD protection element 300. Therefore, the ESD protection element 300 may include one or more electrical shorts 333, e.g. one or more pn-shorts 333 bypassing for example the pn-junction (or, in other words, bypassing the depletion region) formed by the p-type region 321 of the vertical bypass diode 320 and the n-type semiconducting substrate 301. The pn-short 333 may be provided by forming a trench or a trench structure through the n-type semiconducting layer 301n and through the p-type semiconducting layer 301p into the n-type semiconducting substrate 301 and filling the trench with an electrically conductive material, e.g. with a metal or metal alloy, e.g. including tungsten, copper and/or aluminum.

According to various embodiments, using at least one pn-short 333 may allow efficiently integrating a vertical diode (e.g. a vertical bypass diode 320) (including only one pn-junction) next to a vertical thyristor or transistor (including more than one pn-junction).

According to various embodiments, the vertical thyristor 310 of the ESD protection element 300 may include a first p-type region 311, e.g. provided in the n-type semiconducting layer 301n, wherein the first p-type region 311 of the vertical thyristor 310 may be electrically connected to the first contact 303 by one or more electrodes 303v extending through the electrically insulating layer or layer stack (e.g. through the oxide layer 303o and through the passivation layer 303p) provided between the n-type semiconducting layer 301n and the first contact 303. Further, the first p-type region 311 of the vertical thyristor 310 and the one or more electrodes 303v contacting the first p-type region 311 may be configured to form one or more ohmic contacts.

According to various embodiments, the vertical thyristor 310 may include an n-type region 312, e.g. provided as part of the n-type semiconducting layer 301n, wherein the n-type region 312 and the first p-type region 311 may provide a first pn-junction of the vertical thyristor 310. Further, the vertical thyristor 310 may include a second p-type region 313, e.g. provided as part of the p-type semiconducting layer 301p, wherein the n-type region 312 and the second p-type region 313 may provide a second pn-junction of the vertical thyristor 310. Further, the second p-type region 313 and the n-type semiconducting substrate 301 may provide a third pn-junction of the vertical thyristor 310.

According to various embodiments, the ESD protection element 300 may include a further n-type region 304 (e.g. optionally); the further n-type region 304 may be higher doped than the n-type region 312 of the vertical thyristor 310. According to various embodiments, the further n-type region 304 and the second p-type region 313 may provide a Zener diode 330. The Zener diode 330 may be electrically connected to the second contact 302, e.g. to ground (GND) potential, via one or more pn-shorts 333, as illustrated in FIG. 3.

Further, the n-type region 312 of the vertical thyristor 310 and n-type region 322 of the vertical bypass diode 320 may be both part of the epitaxially grown n-type semiconducting layer 301n or may be provided by the epitaxially grown n-type semiconducting layer 301n, e.g. by an n-type doped silicon layer. Accordingly, the vertical thyristor 310 and the vertical bypass diode 320 may be electrically separated from each other by one or more isolation trenches 305. The n-type regions 323 and 304 may have a higher dopant concentration than the n-type regions 312 and 322 (or, in other words, the n-type regions 323 and 304 may have a higher dopant concentration than the n-type semiconducting layer 301n).

According to various embodiments, the n-type semiconducting substrate 301 (or any type of suitable n-type doped carrier 301) may have a thickness less than for example 100 µm. The ESD protection element 300 provided herein according to various embodiments may be configured as vertical device with a (illustratively vertical) current flow from the front side (e.g. from the first contact 303) to the back side (e.g. to the second contact 302).

According to various embodiments, the pn-shorts 333 may be provided in the ESD protection element 300 by forming a trench filled with low-ohmic electrically conductive material, e.g. by depositing a liner, e.g. including titanium and/or titanium nitride, into the trench and subsequently filling the trench with a metal, e.g. with tungsten. Further, the electrodes 303v (or, in other words, the vias 303v or the contact metallization) may include tungsten.

As illustrated in FIG. 3A, the isolation trenches 305 may extend through the n-type semiconducting layer 301n into the p-type semiconducting layer 301p. Further, according to various embodiments, one or more isolation trenches 305 may extend through the n-type semiconducting layer 301n into the p-type region 321 of the vertical bypass diode 320, as illustrated in FIG. 3B, wherein one or more further isolation trenches 305 may extend into the further n-type region 304 of the vertical thyristor 310, and, for example, not into the second p-type region 313 of the vertical thyristor 310. According to various embodiments, the isolation trenches 305 electrically separating the vertical bypass diode 320 and the vertical thyristor 310 from each other may or may not extend into the n-type semiconducting substrate 301.

FIGS. 3A and 3B respectively illustrate an ESD protection element 300 provided by a vertical n-p-diode and a vertical p-n-p-n-thyristor coupled in parallel to each other between the I/O terminal 303 and the ground (GND) terminal 302. However, the ESD protection element 300 may be provided analogously in the opposite doping, e.g. with a vertical p-n-diode and a vertical n-p-n-p-thyristor.

Figure 4:
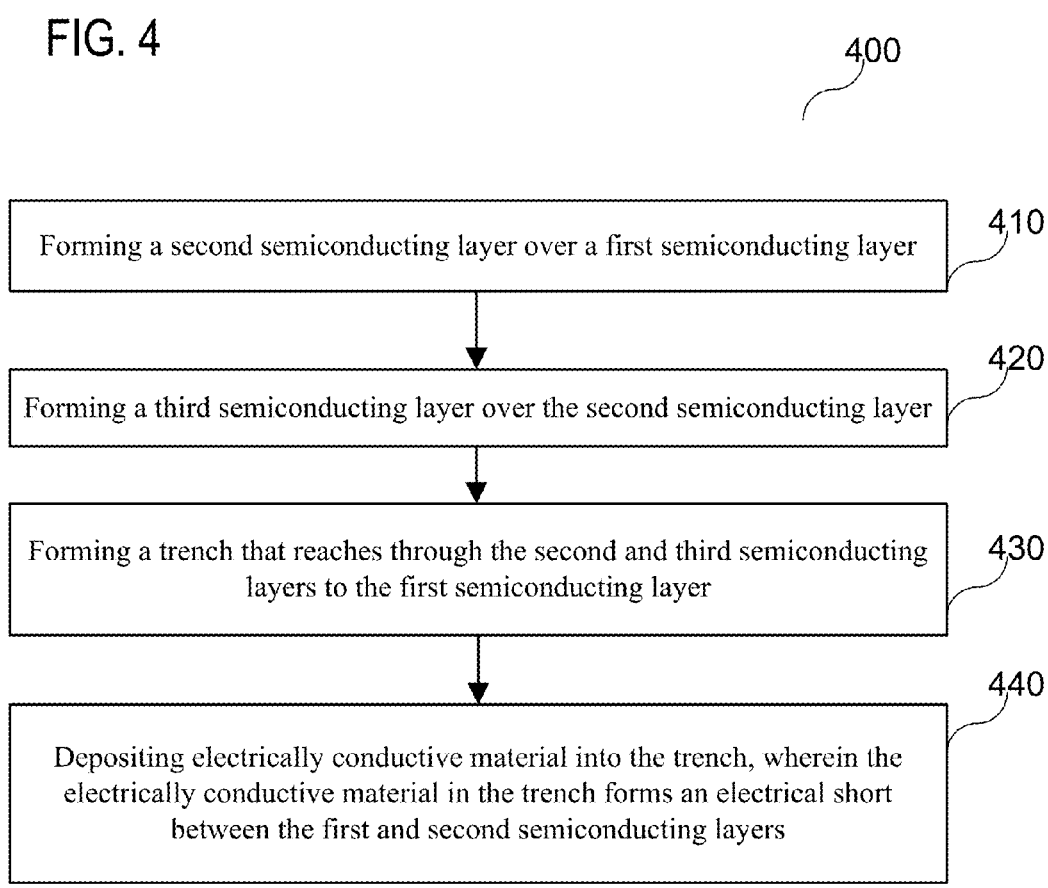
FIG. 4 shows a schematic flow diagram of a method of manufacturing a vertically integrated semiconductor device according to various embodiments.

FIG. 4 illustrates a schematic flow diagram of a method 400 of manufacturing a vertically integrated semiconductor device, according to various embodiments, wherein the method 400 may include: in 410, forming a second semiconducting layer over a first semiconducting layer; in 420, forming a third semiconducting layer over the second semiconducting layer; in 430, forming a trench that reaches through the second and third semiconducting layers to the first semiconducting layer; and, in 440, depositing electrically conductive material into the trench, wherein the electrically conductive material in the trench forms an electrical short (also referred to as electrical bypass) between the first and second semiconducting layers.

Figure 5A:
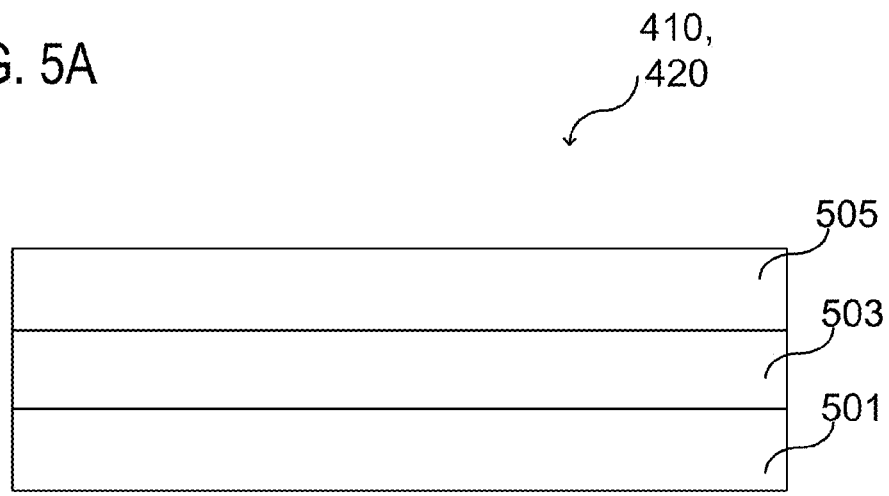

FIG. 5A illustrates a vertically integrated semiconductor device in a schematic cross-sectional view during processing, according to various embodiments, e.g. after process 410 and 420 of method 400 have been carried out, e.g. after forming a second semiconducting layer 503 over a first semiconducting layer 501 and forming a third semiconducting layer 505 over the second semiconducting layer 503. According to various embodiments, the vertically integrated semiconductor device may include at least three layers 501, 503, and 505 forming a layer stack, each layer including semiconductor material or consist of semiconductor material. Further, the first semiconducting layer 501 may be (e.g. part of) a semiconductor carrier 501, e.g. a semiconductor substrate 501, a semiconductor wafer 501, or a semiconductor work piece 501. The first semiconducting layer 501 may include doped semiconductor material, e.g. p-type doped or n-type doped semiconductor material. The semiconductor material of the first semiconducting layer 501 may be silicon or any other semiconductor material processed in semiconductor technology. The second semiconducting layer 503 may include doped semiconductor material, e.g. p-type doped or n-type doped semiconductor material. The semiconductor material of the second semiconducting layer 503 may be silicon or any other semiconductor material processed in semiconductor technology. The third semiconducting layer 505 may include doped semiconductor material, e.g. p-type doped or n-type doped semiconductor material. The semiconductor material of the third semiconducting layer 505 may be silicon or any other semiconductor material processed in semiconductor technology.

According to various embodiments, the second semiconducting layer 503 may be deposited over the first semiconducting layer 501 (e.g. over a semiconductor carrier 501 or any type of semiconducting layer 501) by chemical vapor deposition (CVD) or physical vapor deposition (PVD). According to various embodiments, the second semiconducting layer 503 may be epitaxially deposited over the first semiconducting layer 501, e.g. by CVD or PVD. According to various embodiments, the third semiconducting layer 505 may be epitaxially deposited over the second semiconducting layer 503, e.g. by CVD or PVD. Therefore, the first semiconducting layer 501 may be a silicon layer 501 or a silicon carrier 501, the second semiconducting layer 503 may be a silicon layer 503, and the third semiconducting layer 505 may be a silicon layer 505 as well. Alternatively, all three semiconducting layers 501, 503, and 505 may be epitaxially grown over a carrier (not illustrated).

According to various embodiments, the first semiconducting layer 501 may include p-type doped silicon, the second semiconducting layer 503 may include n-type doped silicon, and the third semiconducting layer 505 may include p-type doped silicon. Alternatively, the first semiconducting layer 501 may include n-type doped silicon, the second semiconducting layer 503 may include p-type doped silicon, and the third semiconducting layer 505 may include n-type doped silicon.

Figure 5B:
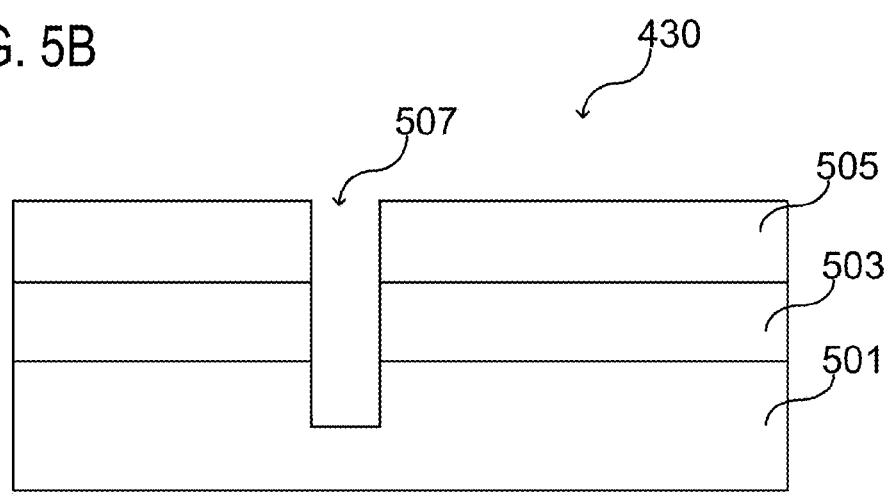

FIG. 5B illustrates a vertically integrated semiconductor device in a schematic cross-sectional view during processing, according to various embodiments, e.g. after processes 410, 420, and 430 of method 400 have been carried out, e.g. after forming a second semiconducting layer 503 over a first semiconducting layer 501, forming a third semiconducting layer 505 over the second semiconducting layer 503, and forming at least one trench 507 that reaches through the second and third semiconducting layers 503, 505 to the first semiconducting layer 501 (e.g. into the first semiconducting layer 501, as shown).

The at least one trench 507 may be formed by a patterning process as used in semiconductor technology, e.g. by photolithography and by etching, e.g. dry etching. Accordingly, a patterned mask layer may be provided over the third semiconducting layer 505 defining the position of the at least one trench 507. According to various embodiments, forming the trench 507 (e.g. in process 430 of method 400) may include etching (or, in other words, partially removing) at least the second and third semiconducting layers 503, 505. Further, forming the trench 507 (e.g. in process 430 of method 400) may include etching (or, in other words, partially removing) the first, second, and third semiconducting layers 501, 503, 505.

Figure 5C:
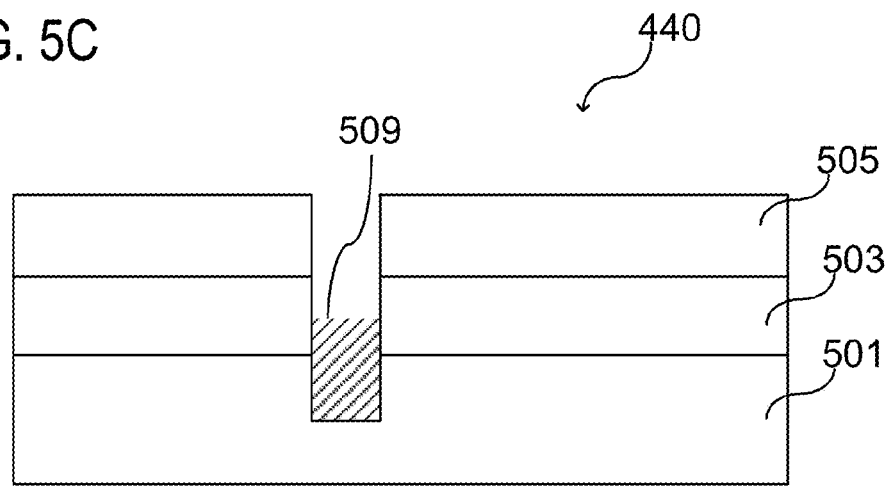

FIG. 5C illustrates a vertically integrated semiconductor device in a schematic cross-sectional view during processing, according to various embodiments, e.g. after processes 410, 420, 430, and 440 of method 400 have been carried out, e.g. after forming a second semiconducting layer 503 over a first semiconducting layer 501, forming a third semiconducting layer 505 over the second semiconducting layer 503, forming at least one trench 507 that reaches through the second and third semiconducting layers 503, 505 to the first semiconducting layer 501, and depositing electrically conductive material 509 into the trench 507, wherein the electrically conductive material 509 in the trench 507 forms at least an electrical bypass between the first and second semiconducting layers 501, 503.

According to various embodiments, the first and second semiconducting layers 501, 503 may be oppositely doped semiconducting layers forming a pn-junction, wherein the electrically conductive material 509 in the trench 507 electrically bridges or electrically bypasses the pn-junction (or, in other words, the electrically conductive material 509 in the trench 507 electrically bridges or electrically bypasses the depletion region of the pn-junction).

According to various embodiments, the semiconducting layers 501, 503, and 505 may allow forming a vertical diode and forming a vertical transistor next to the vertical diode, wherein the semiconducting layers 501, 503, and 505 may provide two pn-junctions for the vertical transistor and two pn-junctions for the vertical diode, wherein one of the two pn-junctions for the vertical diode may be electrically bypassed by the electrically conductive material 509 in the trench 507.

According to various embodiments, the semiconducting layers 501, 503, and 505 may allow forming a vertical diode and forming a vertical thyristor next to the vertical diode, wherein the semiconducting layers 501, 503, and 505 may provide at least two pn-junctions for the vertical thyristor (further doped regions may be provided by doping or counter doping) and two pn-junctions for the vertical diode, wherein one of the two pn-junctions for the vertical diode may be electrically bypassed by the electrically conductive material 509 in the trench 507. According to various embodiments, the semiconducting layers 501, 503, and 505 may allow forming a vertical transistor and a vertical thyristor next to the vertical transistor.

According to various embodiments, the electrically conductive material 509 may include at least one metal, e.g. copper, aluminum, tungsten, titanium, nickel, and the like, or at least one metal alloy, e.g. a copper/aluminum alloy, or any other electrically conductive (e.g. metallic) alloy.

According to various embodiments, the at least one trench 507 may be at least partially filled with the electrically conductive material 509, as for example illustrated in FIG. 5C. Further, as for example illustrated in FIG. 5D, the at least one trench 507 may be completely filled with the electrically conductive material 509. However, as for example illustrated in FIG. 5E, the sidewall of the at least one trench may be partially covered with an electrically insulating material 511 for preventing an electrical short between the second semiconducting layer 503 and the third semiconducting layer 505. This may, for example, allow an easier processing.

According to various embodiments, forming the trench 507 (e.g. in process 430 of method 400) may include: forming the trench 507 to a first depth such that the trench reaches through the third semiconducting layer 505 to the second semiconducting layer 503; covering a sidewall or sidewalls of the trench 507 with electrically insulating material; and, subsequently, extending the trench to a second depth such that the extended trench reaches through the second semiconducting layer 503 to the first semiconducting layer 501. According to various embodiments, the electrically insulating material 511 may include borosilicate glass, however other insulating materials may be used in accordance with various embodiments. Alternatively, according to various embodiments, forming the trench 507 (e.g. in process 430 of method 400) may include: forming the trench 507 to a first depth such that the trench reaches through the third semiconducting layer 505 to the second semiconducting layer 503; covering a sidewall or sidewalls of the trench 507 with a dopant source (e.g. with a highly doped or over doped material or with any material acting as a dopant source, e.g. a highly doped oxide or a highly doped glass); diffusing dopant from the doped source into the third semiconducting layer 505, thereby generating a pn-junction in the third semiconducting layer 505; and, subsequently, extending the trench to a second depth such that the extended trench reaches through the second semiconducting layer 503 to the first semiconducting layer 501. Optionally, the dopant source may be removed after the dopant is diffused into the third semiconducting layer 505. If the trench 507 is filled with a metal, the pn-junction provided in the third semiconducting layer 505 by the diffused dopant may electrically separate the third semiconducting layer 505 from the metal in the trench 507.

Further, as for example illustrated in FIG. 5F, only the sidewall or the sidewalls of the at least one trench 507 may be covered with the electrically conductive material 509, e.g. with a metal or metal alloy, e.g. by performing a conformal deposition process, e.g. plating, atomic layer deposition (ALD), or a CVD process (e.g. atomic layer CVD or low pressure CVD).

According to various embodiments, a liner, e.g. a titanium liner, may be deposited into the trench 507 before further electrically conductive material 509 may be deposited into the trench 507.

Further, according to various embodiments, the electrically conductive material 509 or, in various embodiments, the liner material may be selected so that an ohmic contact may be formed with the semiconducting material of at least one of the semiconducting layers 501, 503, and 505. Alternatively, the electrically conductive material 509 or, in various embodiments, the liner material may be selected so that a Schottky contact may be formed with the semiconducting material of at least one of the semiconducting layers 501, 503, and 505.

According to various embodiments, the second semiconducting layer 503 may have a high impedance or a high electrical resistance, therefore the electrically conductive material 509 in the trench 507 may electrically bypass the second semiconducting layer 503. The second semiconducting layer 503 may include for example a lowly doped or undoped semiconducting material, e.g. lowly doped or undoped silicon. In this case, the first and second semiconducting layers 501, 503 may be of the same doping type, wherein no pn-junction is formed between the first and second semiconducting layers 501, 503.

Figure 6:
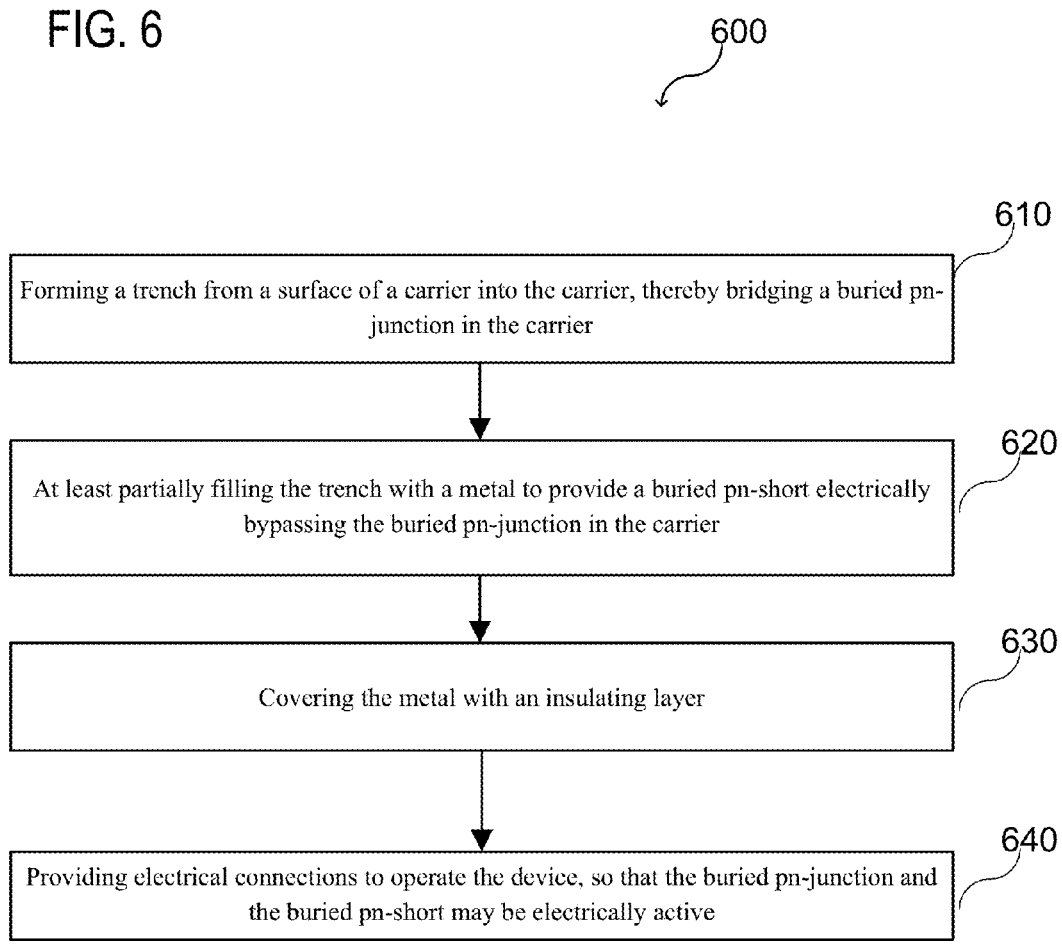
FIG. 6 shows a schematic flow diagram of a method for manufacturing a semiconductor device according to various embodiments.

FIG. 6 illustrates a schematic flow diagram of a method 600 (e.g. a process flow 600) for manufacturing a semiconductor device, according to various embodiments, wherein the method 600 may include: in 610, forming a trench (e.g. a deep trench) from a surface of a carrier (e.g. a semiconductor wafer) into the carrier, thereby bridging a buried pn-junction in the carrier; in 620, at least partially filling the trench with a metal to provide a buried pn-short electrically bypassing the buried pn-junction in the carrier; in 630, covering the metal with an insulating layer; and, in 640, providing electrical connections to operate the device, so that the buried pn-junction and the buried pn-short may be electrically active.

According to various embodiments, a process flow for manufacturing a semiconductor device may include: depositing an electrically insulating layer (e.g. an oxide layer) over a wafer front side; patterning the electrically insulating layer (e.g. performing an oxide opening) (e.g. applying photolithography); etching a trench (e.g. a deep trench) into the wafer material (e.g. the wafer material including or consisting of silicon), thereby bridging a buried implantation layer (e.g. a buried layer or buried pn-junction); depositing a metal over the surface of the wafer front side, thereby filling the trench with metal (e.g. tungsten) and providing a buried pn-short; removing deposited metal from the entire surface of the wafer front side; covering the metal (e.g. remaining in the trench) with an insulating layer; planarizing the wafer front side; and, providing electrical connections to operate the semiconductor device, so that the buried pn-short may be electrically active.

In the following, FIG. 7A to FIG. 7H show a semiconductor device 700 respectively in a schematic cross-sectional view during processing or during manufacture according to various embodiments.

At a (e.g. initial) processing stage, as illustrated in FIG. 7A according to various embodiments, a carrier 701 (e.g. a semiconductor wafer 701, a chip 701, a die 701 or a semiconductor work piece 701) may include at least a buried region 701*b* arranged in semiconductor material of the carrier 701. The carrier 701 may include a substrate region 701*a* including p-type or n-type doped semiconducting material. The carrier 701 may further include an epitaxially grown region 701*c* including p-type or n-type doped semiconducting material. The epitaxially grown region 701*c* may include the same semiconducting material as the substrate region 701*a* and the same doping type as the substrate region 701*a*, e.g. p-type doped silicon or n-type doped silicon. The buried region 701*b* may be arranged between the substrate region 701*a* and the epitaxially grown region 701*c*. Alternatively, the buried region 701*b* may be formed in a monolithic wafer including the regions 701*a*, 701*c*.

Optionally, an isolation trench 705 may be formed in the carrier 701, e.g. vertically extending through the epitaxially grown region 701*c* into the buried region 701*b*. The buried region 701*b* may include p-type or n-type semiconducting material. According to various embodiments, the buried region 701*b* may include the same semiconducting material as the substrate region 701*a* and/or the epitaxially grown region 701*c* and the same doping type or the opposite doping type than the substrate region 701*a* and/or the epitaxially grown region 701*c*, e.g. p-type doped silicon or n-type doped silicon. The buried region 701*b* may be a lowly doped region or, in other words, may have a high electrical resistance.

According to various embodiments, an electrical isolation 703*o*, 703*p* may be formed over the surface 701*s* of the carrier 701, the surface 701*s* may be for example a main processing surface of the carrier 701. According to various embodiments, an oxide layer 703*o* may be deposited over the surface 701*s* of the carrier 701, e.g. providing a field oxide (FOX) for a field effect structure, e.g. for a transistor or a thyristor. Further, the oxide layer 703*o* may be covered by a passivation layer 703*p*, e.g. an electrically insulating layer, e.g. including borophosphosilicate glass (BPSG). The buried region may be formed for example by ion implantation.

At a further processing stage, as illustrated in FIG. 7B according to various embodiments, the electrical isolation 703*o*, 703*p* at the surface 701*s* of the carrier 701 may be patterned; or, in other words, the electrical isolation 703*o*, 703*p* may be opened. Therefore, a patterned mask layer 706, e.g. a patterned resist layer 706, may be formed over the electrical isolation 703*o*, 703*p*. The electrical isolation 703*o*, 703*p* may be partially removed by using the patterned mask layer 706 and, for example, an etching process, e.g. dry etching. Thereby, the surface 701*s* of the carrier 701 may be partially exposed.

Figure 7C:
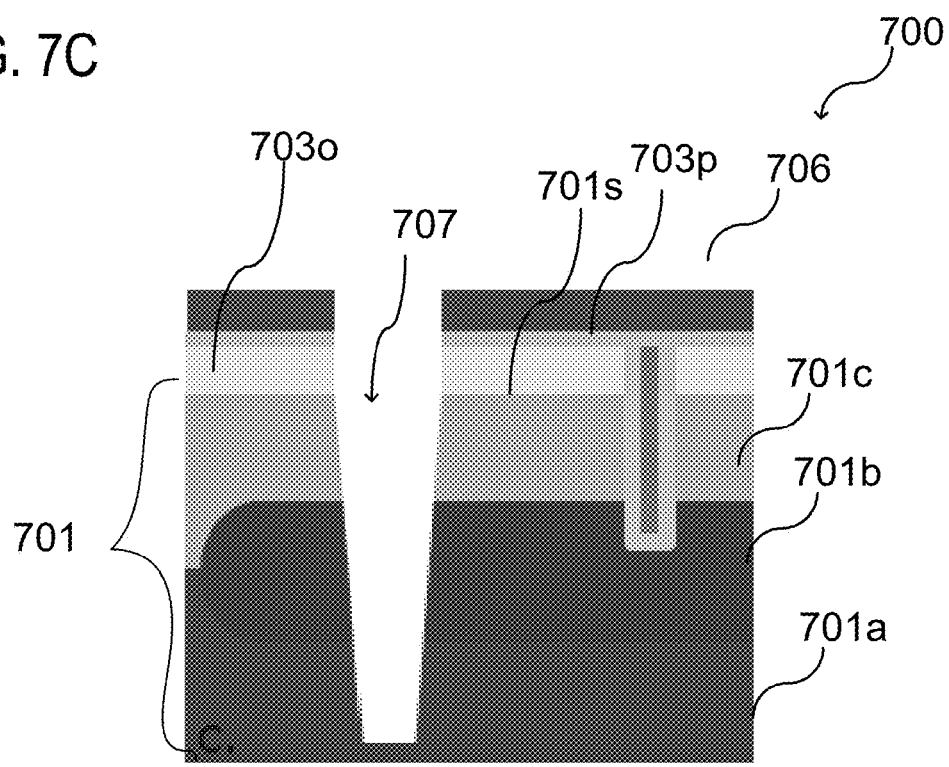

At a further processing stage, as illustrated in FIG. 7C according to various embodiments, a trench 707 may be formed in the carrier 701, the trench 707 extending, e.g. vertically, through the epitaxially grown region 701*c* and through the buried region 701*b* into the substrate region 701*a*. In other words, the trench 707 may bridge the buried region 701*b*. The trench 707 may be formed by etching, e.g. dry etching or deep reactive ion etching. According to various embodiments, the trench 707 may be a deep trench, extending for example more than 10 μm into the carrier 701 (e.g. measured from the surface 701*s* of the carrier 701). The trench may be formed into the semiconductor material of the carrier 701.

Figure 7D:
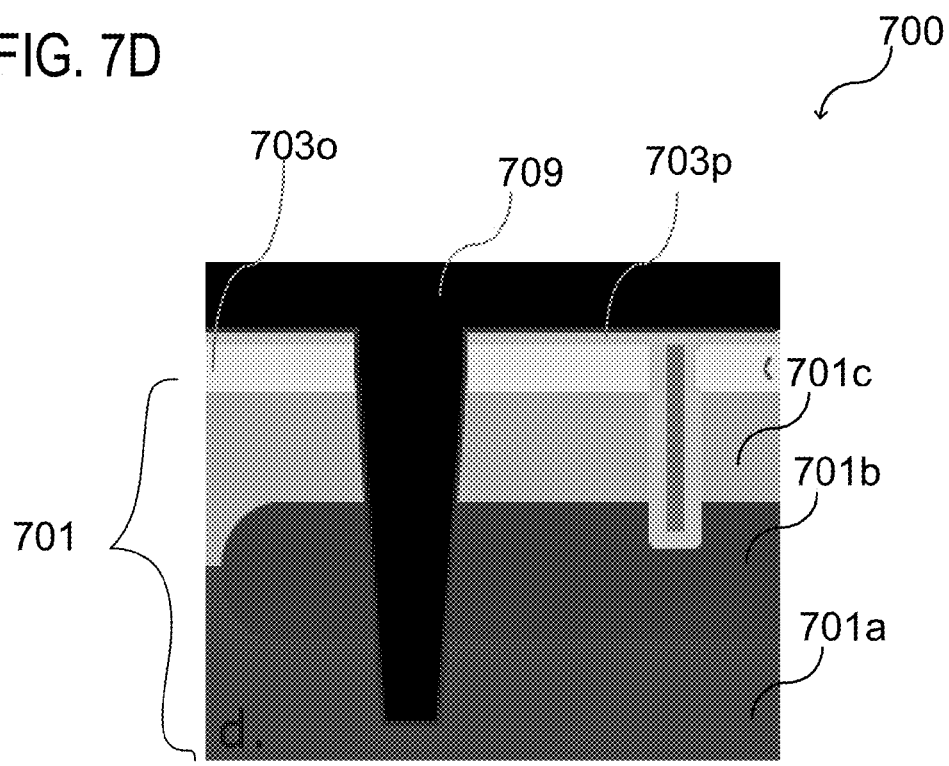

At a further processing stage, as illustrated in FIG. 7D according to various embodiments, a metal 709 may be deposited over the carrier 701, the metal 709 covering the electrical isolation 703*o*, 703*p* and filling the trench 707, e.g. completely. Optionally, a liner may be deposited over the carrier 701 before the metal 709 is deposited; the liner conformally covering exposed surfaces.

As exemplarily illustrated in FIG. 7D, according to various embodiments, the metal 709 in the trench 707 may provide a buried electrical short, e.g. bridging or bypassing the buried region 701*b* (e.g. a lowly doped buried region 701*b*) or bridging or bypassing one or more pn-junctions (depending on the respective doping of the regions 701*a*, 701b, and 701c in the carrier 701) generated by the buried region 701b in the carrier 701.

Figure 7E:
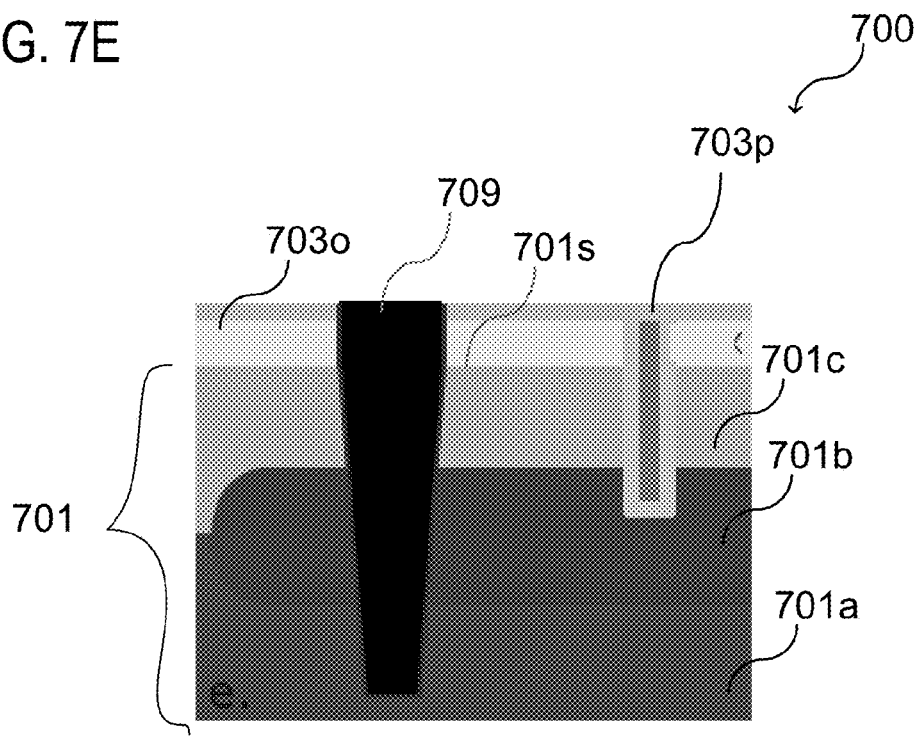

At a further processing stage, as illustrated in FIG. 7E according to various embodiments, the portion of the metal 709 covering the electrical isolation 703o, 703p may be removed. The metal 709 may be removed from the entire front side of the carrier 701; or, in other words, the metal may only remain in the trench 707.

Figure 7F:
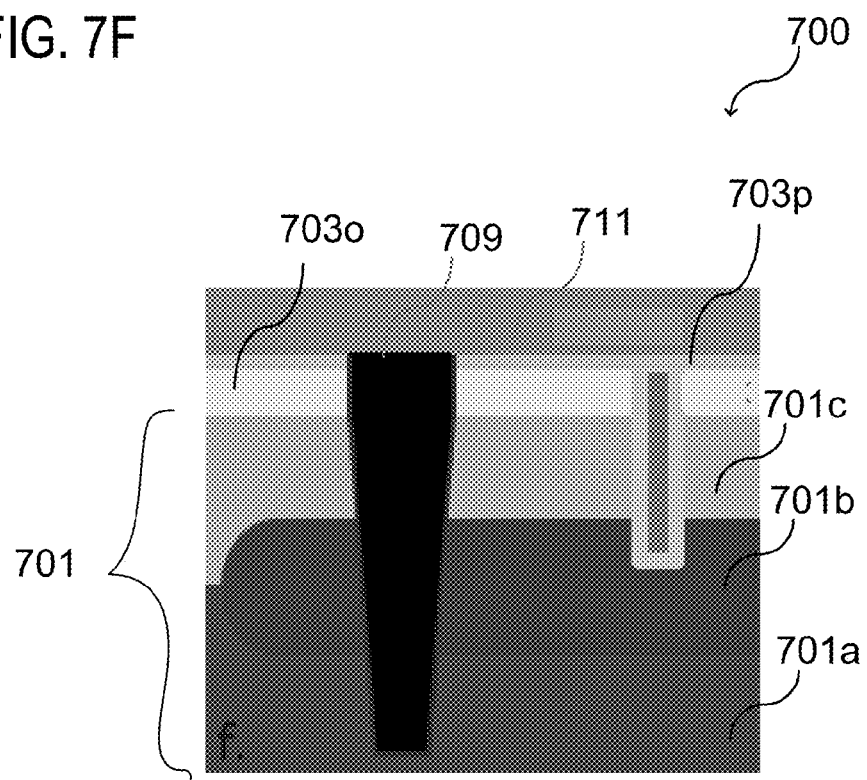

At a further processing stage, as illustrated in FIG. 7F according to various embodiments, a further electrically insulating layer 711 may be deposited over the carrier 701, e.g. including or consisting of borophosphosilicate glass (BPSG). The further electrically insulating layer 711 may cover the metal 709 in the trench 707 and the electrical isolation 703o, 703p.

Figure 7G:
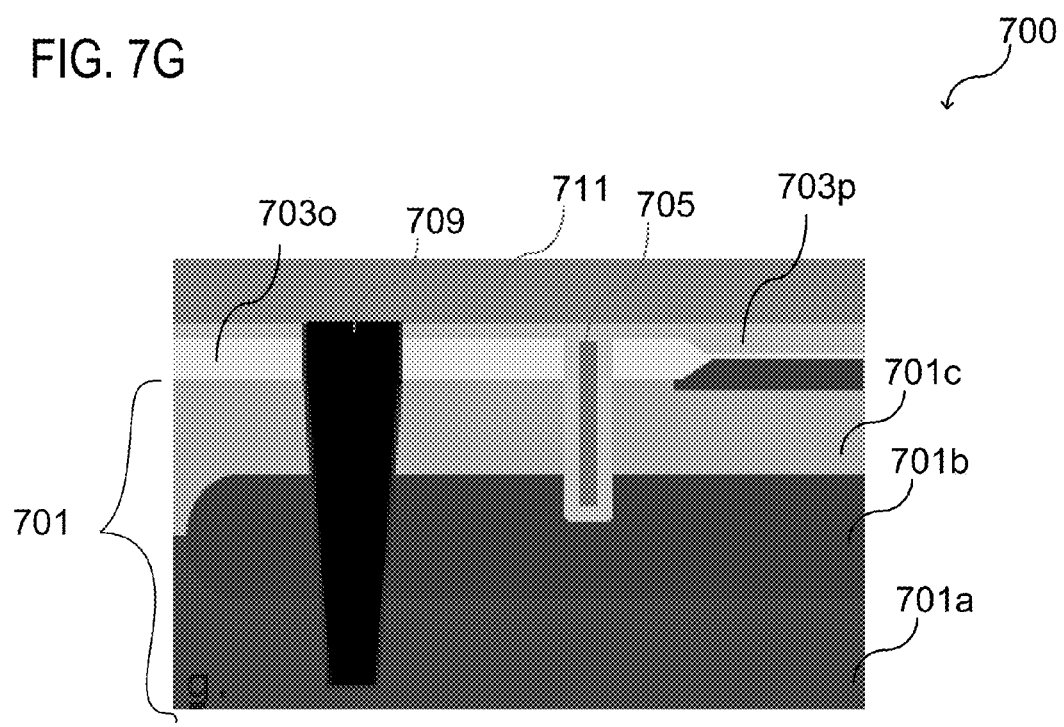

At a further processing stage, as illustrated in FIG. 7G according to various embodiments, the carrier 701 may be planarized, or, in other words, the carrier front side may be planarized, e.g. by chemical mechanical polishing (CMP).

Figure 7H:
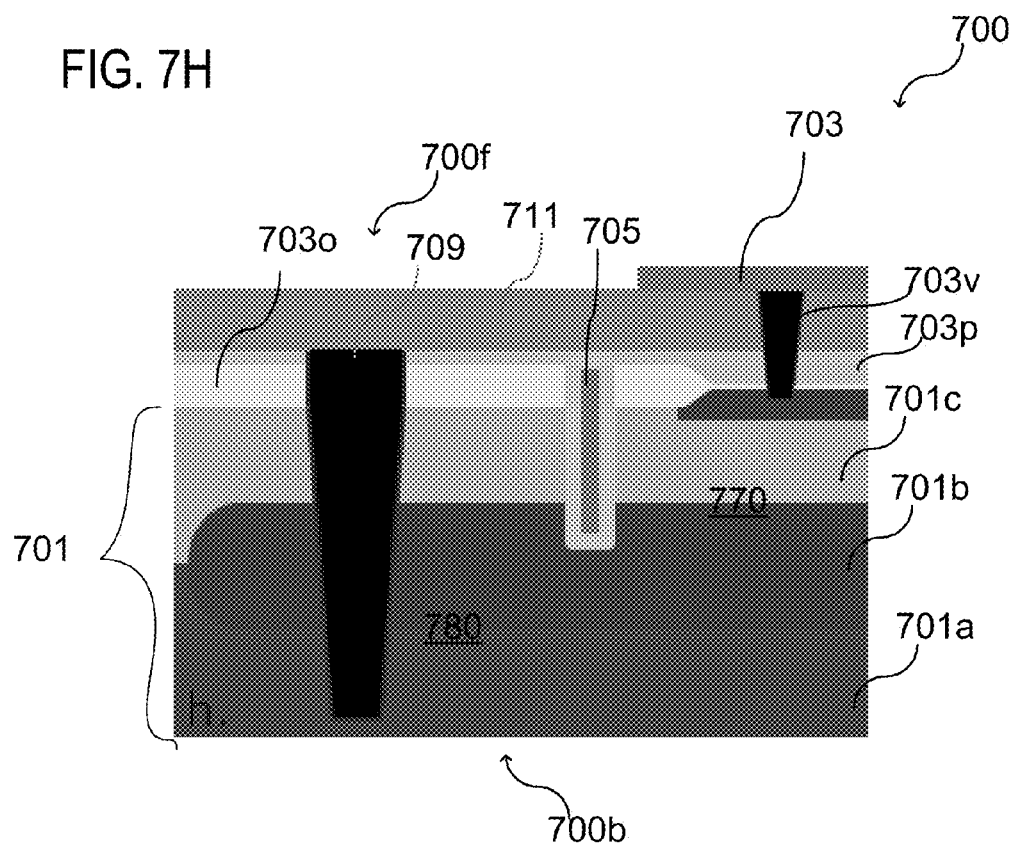

At a further processing stage, as illustrated in FIG. 7H according to various embodiments, electrical connections 703v and a contact pad 703 (e.g. an I/O-terminal 703) may be provided to operate the semiconductor device 700, e.g. to lead current into the regions 701a, 701b, and 701c of the carrier 701. The semiconductor device 700 may be configured as vertical semiconductor device 700 with a current flow from the front side 700f to the back side 700b of the semiconductor device 700 (or of the carrier 701).

The isolation trench 705 may separate for example a first pn-junction 770 (provided for example by oppositely doped regions 701b, 701c) from the electrical bypass (e.g. from the metal 709 in the trench 707) so that the first pn-junction 770 is not bypassed. However, the electrical bypass (e.g. the metal 709 in the trench 707) may electrically bypass or electrically short a second pn-junction 780 (provided for example by oppositely doped regions 701a, 701b).

Figure 8:
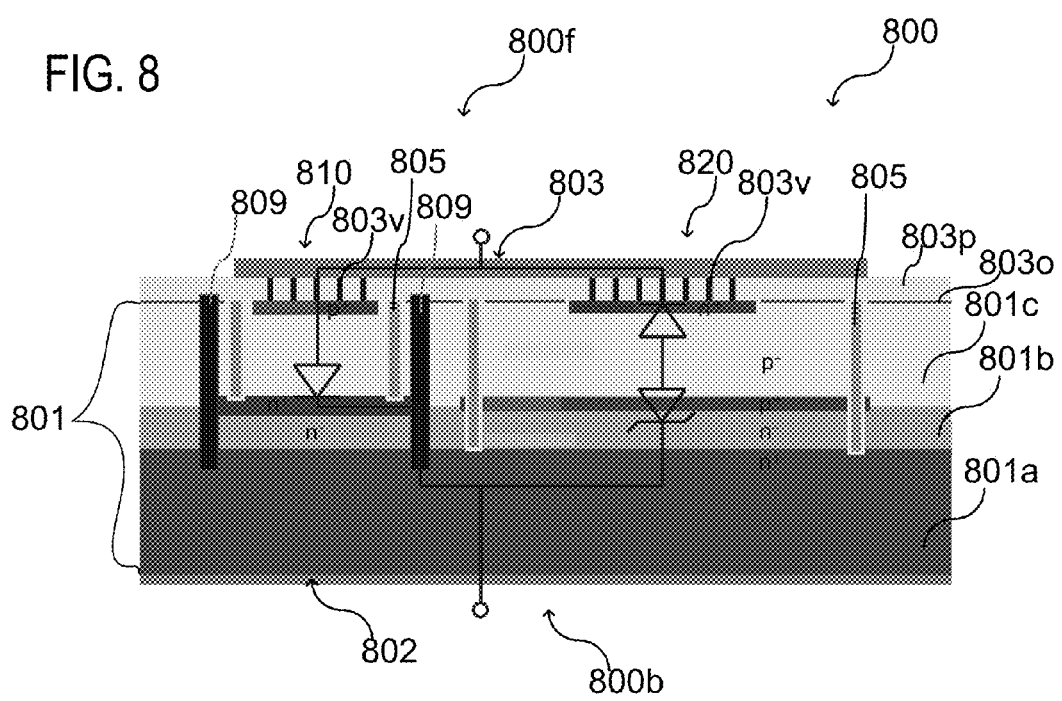
FIG. 8 shows a vertically integrated semiconductor device in a schematic cross-sectional view according to various embodiments.

FIG. 8 shows a vertical semiconductor device 800 in a schematic cross-sectional view according to various embodiments. FIG. 8 also shows an equivalent circuit of the components provided by the plurality of doped semiconducting regions and/or doped semiconducting layers in the semiconductor device 800. According to various embodiments, the vertical semiconductor device 800 may include for example a first diode 810, and two diodes 820 coupled in parallel to the first diode 810, the two diodes 820 may include a second diode and a Zener diode, the second diode and the Zener diode may be coupled in series, e.g. anti-serially, to each other. The vertical semiconductor device 800 may include a carrier 801 (e.g. a wafer 801), wherein the carrier 801 may include a substrate region 801a (e.g. a first layer 801a), a first epitaxial layer 801b (e.g. a second layer 801b) formed over the substrate region 801a, and a second epitaxial layer 801c (e.g. a third layer 801c) formed over the first epitaxial layer 801b. The substrate region 801a may be highly n-type doped ($n^+$), the first epitaxial layer 801b may be lowly n-type doped ($n^-$), the second epitaxial layer 801c may be lowly p-type doped ($p^-$). For forming the diodes, further highly n-type doped ($n^+$) regions and further highly p-type doped ($n^+$) regions may be provided in the carrier 801.

The vertical semiconductor device 800 may include a first electrical contact 803 (e.g. an I/O-terminal, a front side contact pad, or a front side metallization) at a front side 800f of the vertical semiconductor device 800 and a second electrical contact 802 (e.g. a back side contact pad or a back side metallization) at a back side 800b of the vertical semiconductor device 800, e.g. for coupling the vertical semiconductor device 800 to ground (GND) potential.

The first and the second diode 810, 820 may be coupled to the first electrical contact 803 by respectively one or more electrodes 803v (e.g. by vias or by a contact metallization), wherein the one or more electrodes 803v may, e.g. vertically, extend through an electrically insulating layer 803o, 803p disposed between the first electrical contact 803 and the second epitaxial layer 801c (e.g. through an oxide layer 803o and a passivation layer 803p provided over the oxide layer 803o).

The vertical semiconductor device 800 may include isolation trenches 805 and electrical shorts 809 (e.g. trenches filled with metal 809), wherein the isolation trenches 805 and the electrical shorts 809 are provided so that the first epitaxial layer including low n-type doped semiconducting material ($n^-$), may be bypassed for the first diode 810, so that the first diode 810 is coupled to the second contact 802 with a low resistance. Illustratively, a lowly doped semiconducting region may be bypassed by the electrical shorts 809. The isolation trenches 805 may allow for example the proper functioning of the two diodes 820 coupled in parallel to the first diode 810. According to various embodiments, at least one isolation trench 805 may extend through the first and the second epitaxial layers 801b, 801c into the substrate region 801a.

Figure 9A:
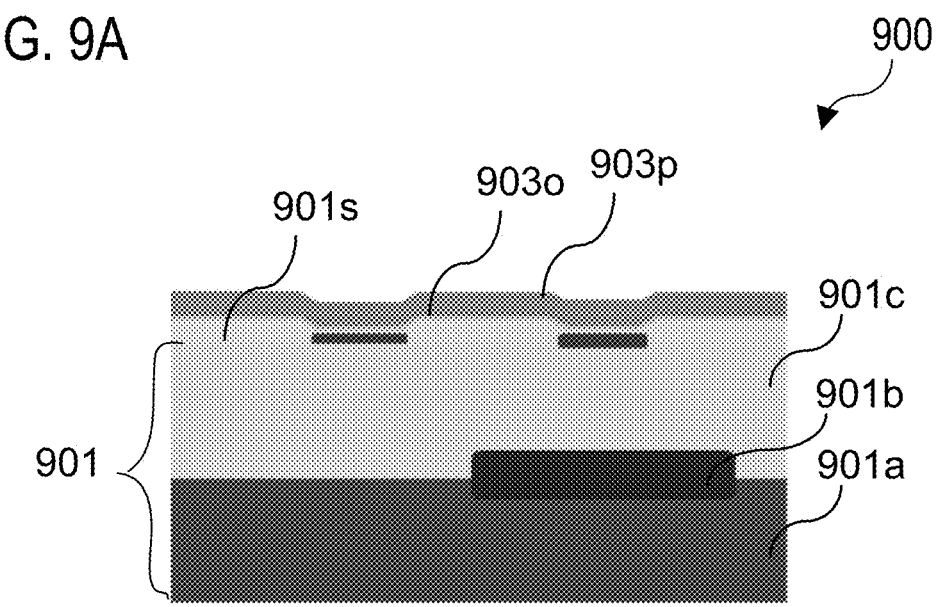
FIGS. 9A to 9E show a semiconductor device during processing respectively in a schematic cross-sectional view according to various embodiments.

In the following, FIG. 9A to FIG. 9E show a semiconductor device 900 respectively in a schematic cross-sectional view during processing or during manufacture according to various embodiments. At a (e.g. initial) processing stage, as illustrated in FIG. 9A according to various embodiments, a carrier 901 (e.g. a semiconductor wafer, a chip or a die) may include at least a buried region 901b arranged in semiconductor material of the carrier 901. The carrier 901 may include a substrate region 901a including p-type or n-type doped semiconducting material. The carrier 901 may further include an epitaxially grown region 901c including p-type or n-type doped semiconducting material. The epitaxially grown region 901c may include the same semiconducting material as the substrate region 901a and the same doping type, e.g. p-type doped silicon or n-type doped silicon. The buried region 901b may be arranged between the substrate region 901a and the epitaxially grown region 901c. Alternatively, the buried region 901b may be formed in a monolithic carrier 901 including the regions 901a, 901c. Alternatively, the carrier 901 may include a polysilicon region 901c or a region 901c including any type of semiconductor material covering the buried region 901b at least partially.

According to various embodiments, the carrier 901 may provide a layer structure for forming a vertical semiconductor device 900, wherein the carrier 901 may include a first layer 901a or first region 901a, a second layer 901b or second region 901b formed over the first layer 901a or first region 901a, and a third layer 901c or third region 901c formed over the second layer 901b or second region 901b. The first layer 901a or first region 901a may be highly n-type doped ($n^+$), the second layer 901b or second region 901b may be highly p-type doped ($p^+$), the third layer 901c or third region 901c may be lowly n-type doped ($n^-$). Alternatively, the first layer 901a or first region 901a may be highly p-type doped (pi, the second layer 901b or second region 901b may be highly n-type doped ($n^+$), the third layer 901c or third region 901c may be lowly p-type doped ($p^-$). Further, other combinations of respective doping types and doping concentrations may be provided as desired for the specific components (e.g. one or more diodes, one or more transistors, or one or more thyristors) to be provided in the carrier 901, cf. for example FIGS. 10A to 10F.

According to various embodiments, an electrical isolation 903o, 903p may be formed over the surface 901s of the carrier 901, the surface 901s may be for example a main processing surface of the carrier 901. According to various embodiments, an oxide layer 903o may be deposited over the surface 901s of the carrier 901, e.g. providing a field oxide (FOX) for a field effect structure, e.g. for a transistor or a thyristor. Further, the oxide layer 903o may be covered by a passivation layer 903p, e.g. by an electrically insulating layer, e.g. including borophosphosilicate glass (BPSG), as already described.

Figure 9B:
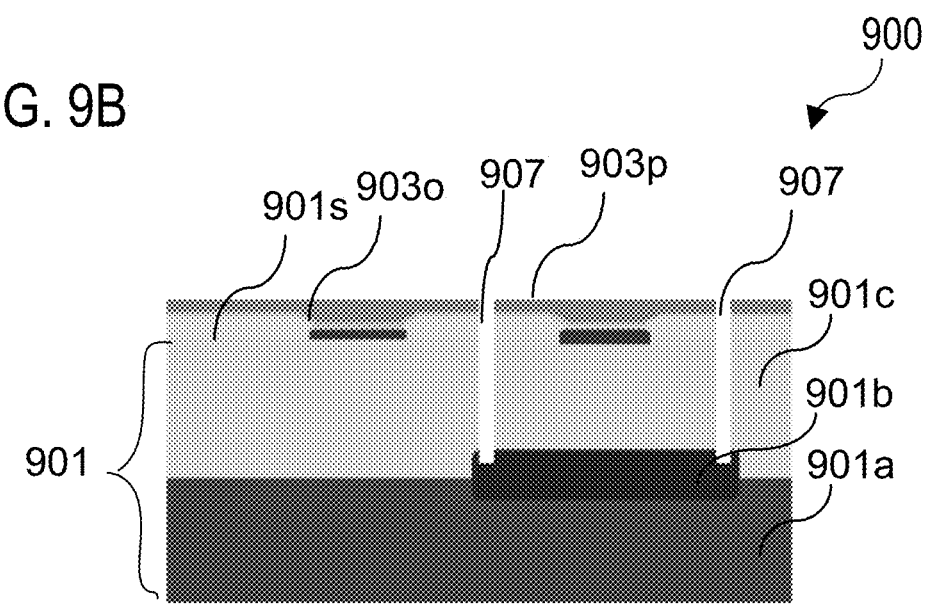
Figure 9C:
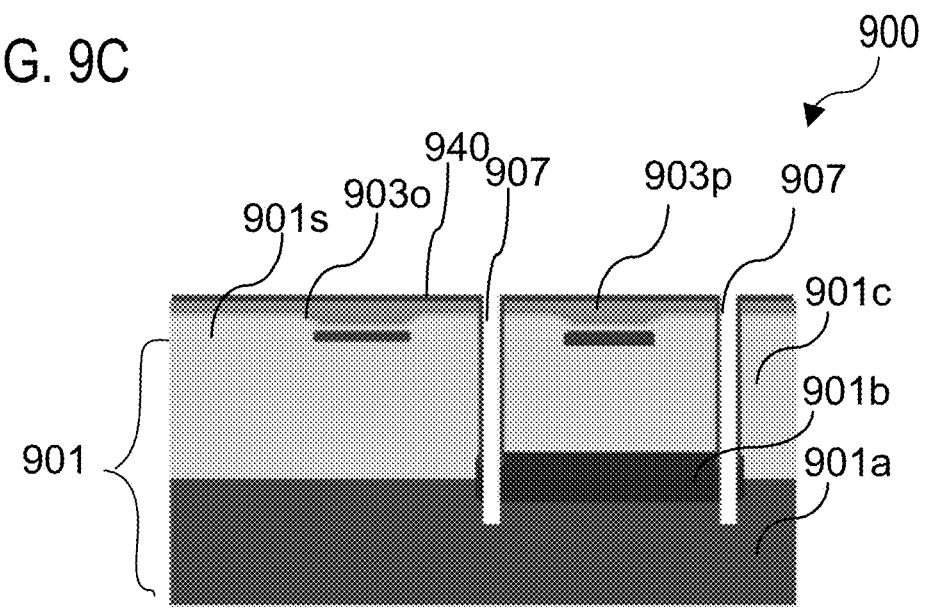

At a further processing stage, as illustrated in FIG. 9B according to various embodiments, at least one trench 907 (e.g. a plurality of trenches 907) may be formed in the carrier 901, wherein the at least one trench 907 may extend, e.g. vertically, through the third layer 901c or third region 901c into the second layer 901b or second region 901b. In other words, at least one trench 907 may be formed with a first depth such that it reaches into the buried layer 901b. The at least one trench 907 may be formed by a first etching, e.g. dry etching or deep reactive ion etching. According to various embodiments, the at least one trench 907 may be a deep trench, extending for example more than 10 μm into the carrier 901 (e.g. measured from the surface 901s of the carrier 901). The at least one trench 907 may be formed into the semiconductor material of the carrier 901. According to various embodiments, the at least one trench 907 may laterally surround a region of the carrier 901.

According to various embodiments, an electrically insulating material 940 (e.g. silicon oxide, e.g. borophosphosilicate glass) may be deposited over the carrier 901, wherein the electrically insulating material 940 may cover the sidewall or sidewalls of the at least one trench 907. The electrically insulating material 940 may be deposited conformally using for example ALD or LPCVD or, in case the carrier may include silicon, using an oven process to grow silicon oxide from the silicon of the carrier 901. Subsequently, the at least one trench 907 may be driven deeper into the substrate 901, e.g. by at least a second etching, e.g. dry etching or deep reactive ion etching. Thereby, the electrically insulating material 940 at the bottom of the at least one trench may be removed before the trench is etched deeper into the carrier 901. After the second etching, the at least one trench 907 may extend, e.g. vertically, through the third layer 901c or third region 901c, through the second layer 901b or second region 901b, into the first layer 901a or first region 901a. In other words, at least one trench 907 may be formed with a second depth through the buried layer 901b such that it extends down to or into the first layer 901a or first region 901a. Illustratively, the at least one trench 907 may bridge the buried layer 901b, as exemplarily illustrated in FIG. 9C.

Alternatively, according to various embodiments, a dopant source material 940 (e.g. highly doped material) may be deposited over the carrier 901, wherein the dopant source material 940 may cover the sidewall or sidewalls of the at least one trench 907. The dopant source material 940 may be deposited conformally using for example ALD, LPCVD or any other deposition process. Further, an annealing or a heat treatment may be carried out to diffuse dopant from the dopant source material 940 into the third layer 901c or third region 901c. In case the third layer 901c or third region 901c is n-type doped, the dopant source material 940 may include p-type dopant material and in case the third layer 901c or third region 901c is p-type doped, the dopant source material 940 may include n-type dopant material. Thereby, an electrically isolating pn-junction (e.g. in blocking direction) may be provided next to the at least one trench 907. Subsequently, the at least one trench 907 may be driven deeper into the substrate 901, e.g. by at least a second etching, e.g. dry etching or deep reactive ion etching. Further, the remaining dopant source material 940 may be removed after the dopant is diffused into the third layer 901c or third region 901c and before the at least one trench 907 is etched deeper into the carrier 901. After the second etching, the at least one trench 907 may extend, e.g. vertically, through the third layer 901c or third region 901c, through the second layer 901b or second region 901b, into the first layer 901a or first region 901a. In other words, at least one trench 907 may be formed with a second depth through the buried layer 901b such that it extends down to or into the first layer 901a or first region 901a. Illustratively, the at least one trench 907 may bridge the buried layer 901b, as exemplarily illustrated in FIG. 9C.

Figure 9D:
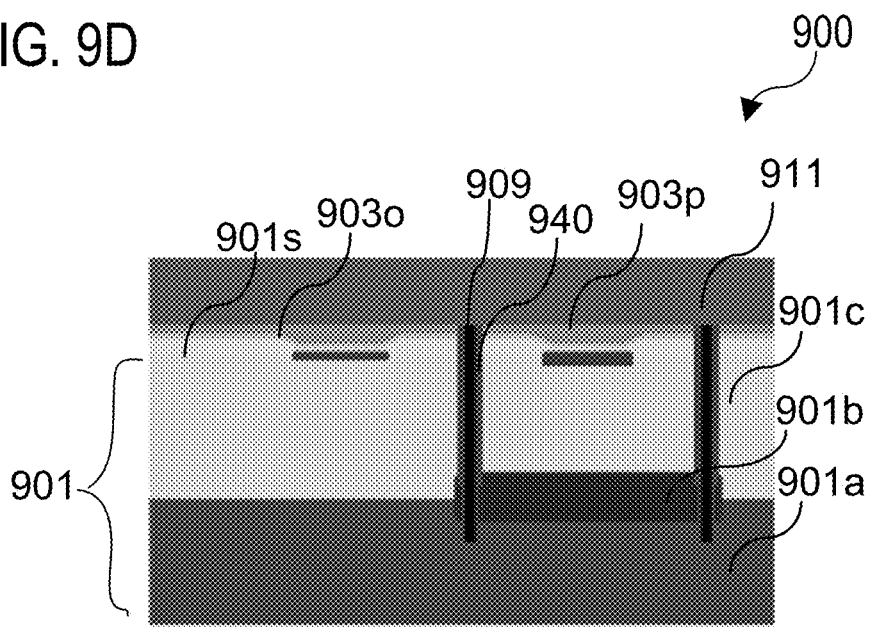

Further, the at least one trench 907 may be at least partially filled with a metal 909 or metallic material 909, as already described and exemplarily illustrated in FIG. 9D. As further exemplarily illustrated in FIG. 9D, according to various embodiments, the metal 909 in the trench 907 may provide a buried electrical short, e.g. bridging or bypassing the second layer or second region 901b (e.g. a lowly doped buried region 901b) or bridging or bypassing one or more pn-junctions generated in the carrier 901 (depending on the respective doping of the semiconducting layers 901a, 901b, and 901c or semiconducting regions 901a, 901b, and 901c).

As further exemplarily illustrated in FIG. 9D, according to various embodiments, a further electrically insulating layer 911 may be deposited over the carrier 901, e.g. including or consisting of borophosphosilicate glass (BPSG) or any other electrically insulating material processed in semiconductor technology. The further electrically insulating layer 911 may cover the metal 909 in the trench 907 and the electrical isolation 903o, 903p. Further, the carrier 901 may be planarized, or, in other words, the carrier front side may be planarized, e.g. by chemical mechanical polishing (CMP).

Figure 9E:
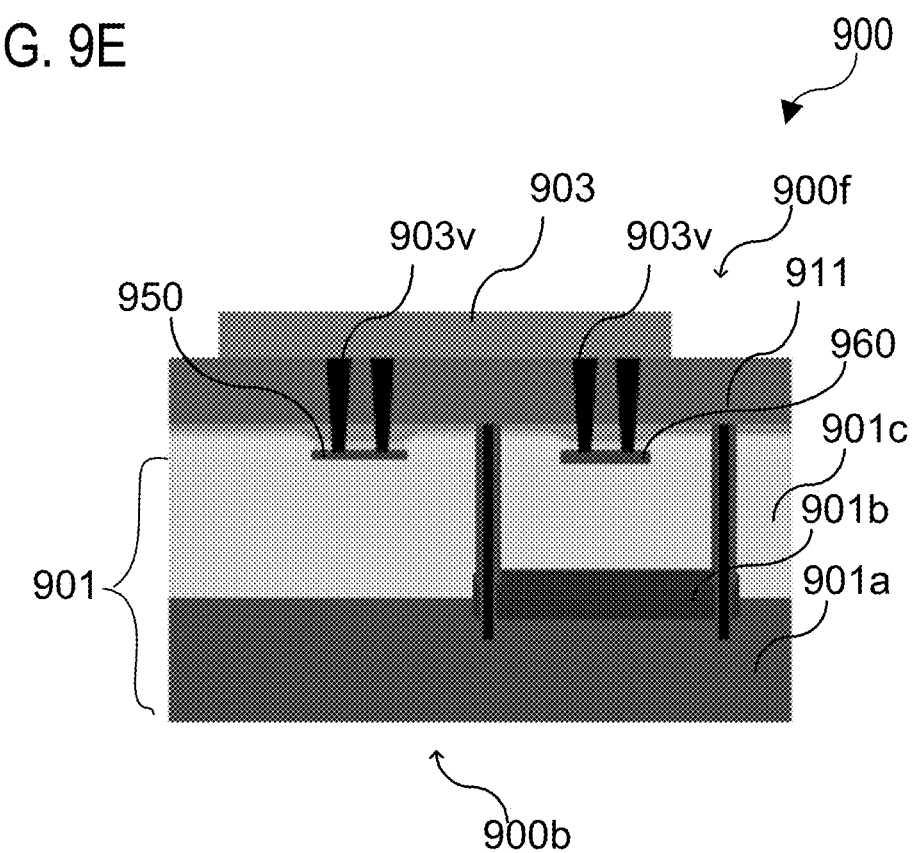
Figure 10A:
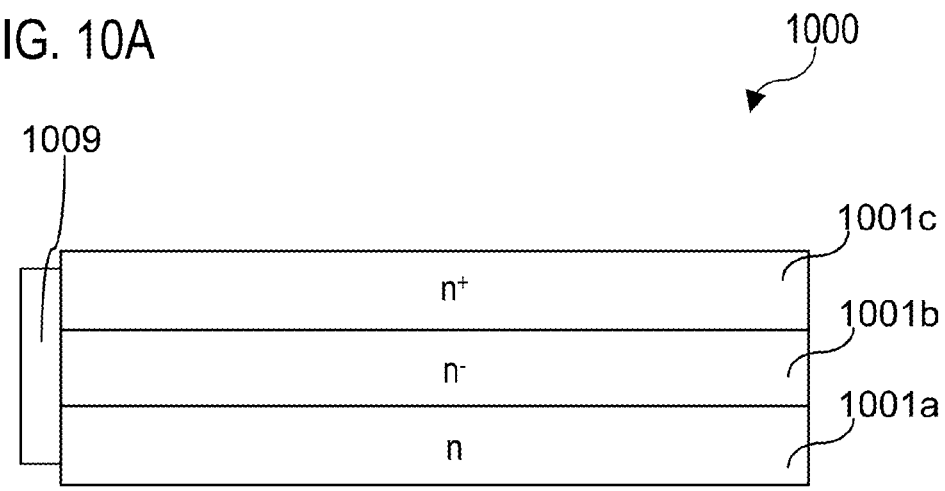
FIGS. 10A to 10F show a semiconductor device respectively in a schematic cross-sectional view according to various embodiments.
Figure 10B:
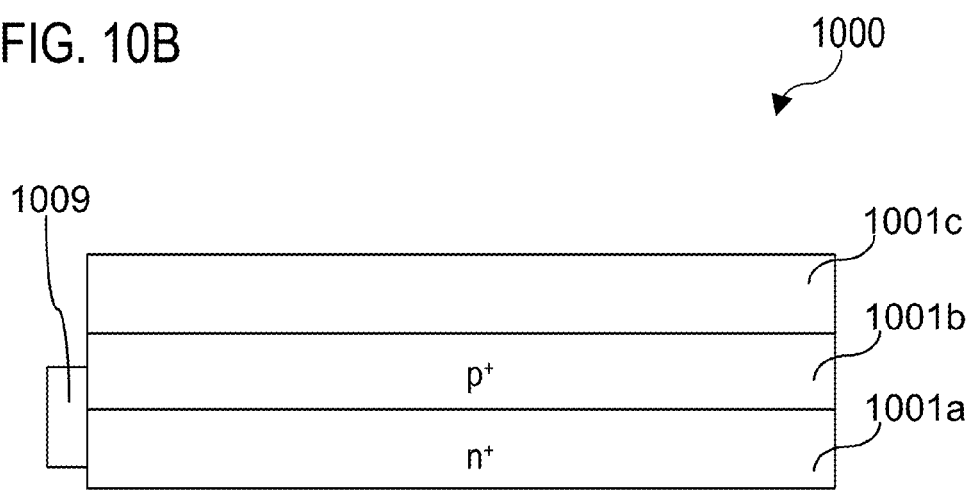
Figure 10C:
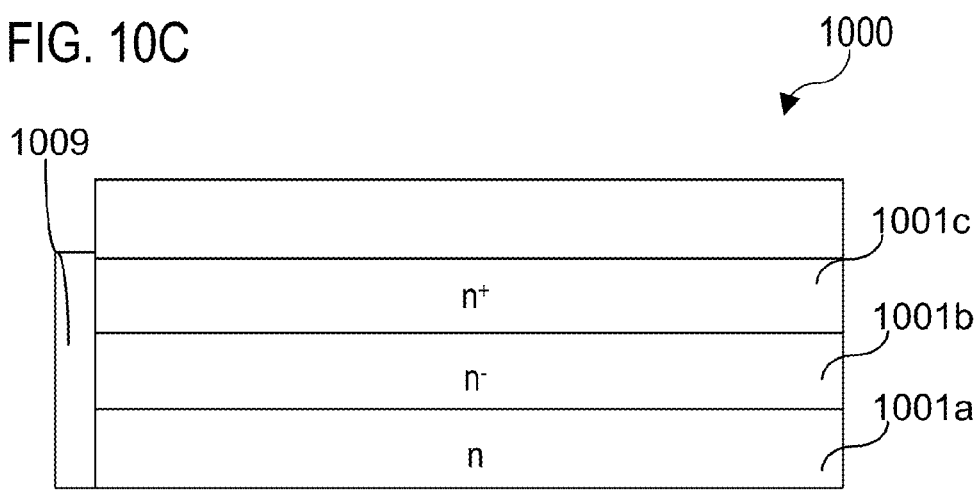
Figure 10D:
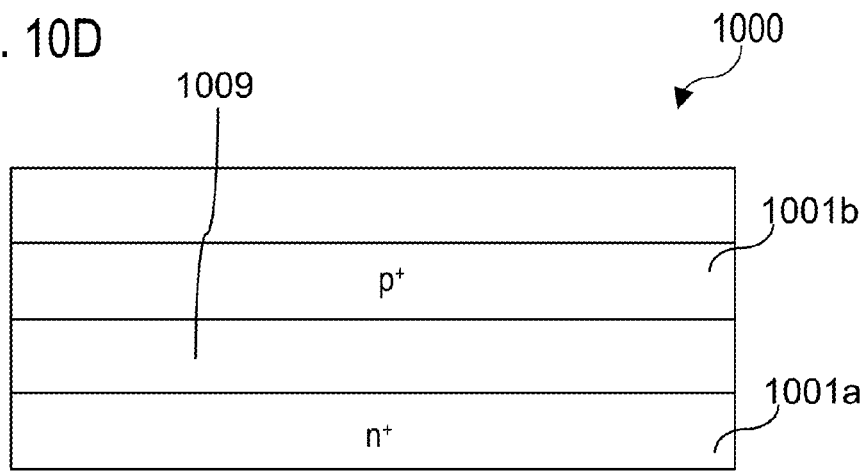
Figure 10E:
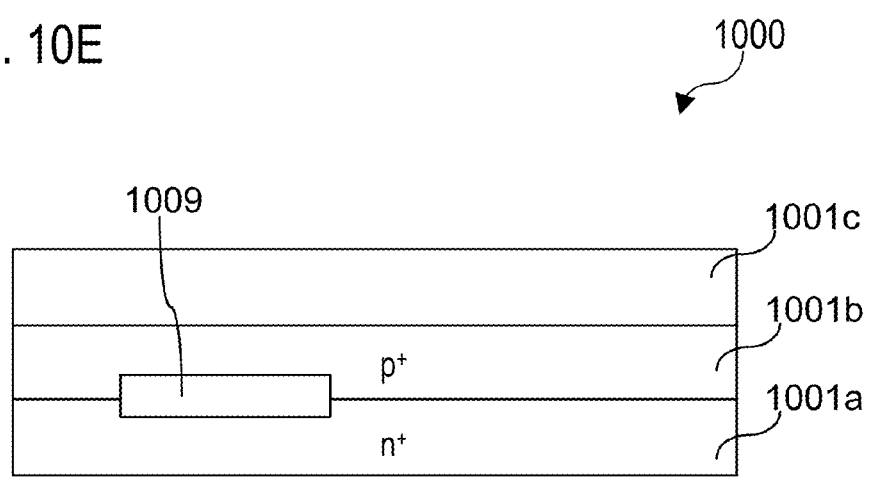
Figure 10F:
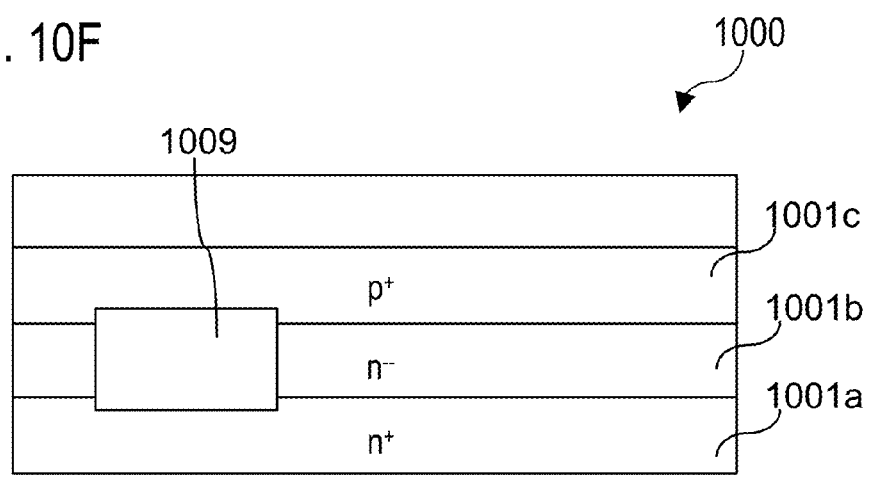

At a further processing stage, as illustrated in FIG. 9E according to various embodiments, electrical connections 903v (e.g. electrodes) and at least one contact pad 903 (e.g. an I/O-terminal 903) may be provided to operate the semiconductor device 900, e.g. to lead current into the layers 901a, 901b, and 901c or regions 901a, 901b, and 901c of the carrier 901. The semiconductor device 900 may be configured as vertical semiconductor device 900 with a current flow from the front side 900f to the back side 900b of the semiconductor device 900 (or of the carrier 901).

According to various embodiments, further doped semiconducting regions 950, 960 may be provided to at least one of electrically contact the third layer 901c (or third region 901c), e.g. to form an ohmic contact, or to form a pn-junction with the third layer 901c (or third region 901c) depending on the doping type of the third layer 901c or third region 901c and the doping type of the further doped semiconducting regions 950, 960.

As exemplarily illustrated in FIG. 9E, the semiconductor device 900 may be configured as a vertical semiconductor device 900, wherein the vertical semiconductor device 900 may include the first electrical contact 903 (e.g. an I/O-terminal, a front side contact pad, or a front side metallization) at the front side 900f of the semiconductor device 900 and a further electrical contact (e.g. a back side contact pad or a back side metallization) at the back side 900b of the vertical semiconductor device 900, e.g. for coupling the vertical semiconductor device 900 to ground (GND).

According to various embodiments, a semiconductor device may be provided, wherein the semiconductor device may include an electrical short buried in the wafer, the chip, or the carrier, as described herein. Therefore, the semiconductor device may have a low capacitance so that the semiconductor device may be a high speed semiconductor device or may be used as a high speed semiconductor device, e.g. a switch, a transmitter, a receiver, a transceiver. Further, the semiconductor device may provide both an optimal bypass diode and an optimal thyristor in the same substrate, e.g. in vertical technology. Further, according to various embodiments, a pn-junction or a depletion region may be bypassed by a metal, the metal forming ohmic contacts with the p-type region and the n-type region of the pn-junction. The pn-junction may be provided in vertical technology. A formation of a Schottky contact may be prevented by using additional highly doped semiconducting regions at the interface between the metal and the semiconducting material.

According to various embodiments, the buried electrical short or the buried electrical bypass, as described herein, may be provided via wafer bonding technology.

In the following, FIG. 10A to FIG. 10F show a semiconductor device 1000 respectively in a schematic cross-sectional view according to various embodiments, wherein the semiconductor device 1000 may include a plurality of semiconducting layers (e.g. two semiconducting layers 1001a, 1001b, three semiconducting layers 1001a, 1001b, 1001c, or more than three semiconducting layers) and at least one electrical short bypassing at least one layer of the plurality of semiconducting layers or bypassing at least one pn-junction generated by the plurality of semiconducting layers. According to various embodiments, for bypassing at least one pn-junction an electrical bypass 1009 may be provided by a metal. For bypassing a layer with a high electrical resistance (e.g. a lowly doped semiconducting layer), the electrical bypass 1009 may be provided by a metal (e.g. tungsten, aluminum, copper, and the like) or by highly doped semiconductor material (e.g. by highly doped polysilicon).

The doping types and doping concentrations are illustrated in the figures as well, wherein $n^+$ denotes a semiconducting layer with a higher n-type doping concentration than a semiconducting layer denoted with n, wherein n denotes a semiconducting layer with a higher n-type doping concentration than a semiconducting layer denoted with $n^-$, and wherein $n^-$ denotes a semiconducting layer with a higher n-type doping concentration than a semiconducting layer denoted with $n^{--}$.

Figure 11:
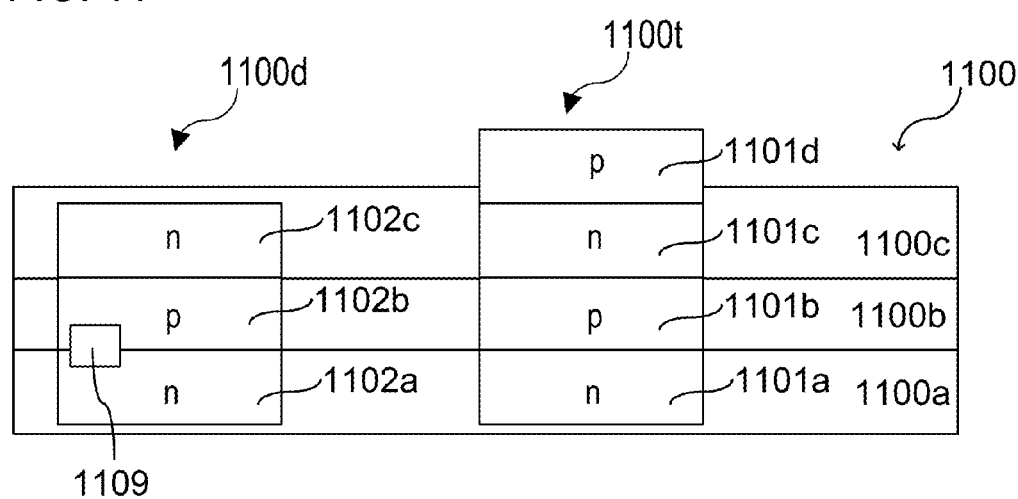
FIG. 11 shows a vertical semiconductor device in a schematic cross-sectional view according to various embodiments.

FIG. 11 schematically illustrates a vertical thyristor 1100t and a vertical diode 1100d integrated into a carrier 1100. The vertical thyristor 1100t may include four semiconducting regions 1101a, 1101b, 1101c, and 1101d providing the respective pn-np-pn-junctions of the vertical thyristor 1100t. The three regions 1101a, 1101b, and 1101c of the vertical thyristor 1100t may be provided by or may be part of three layers 1100a, 1100b, and 1100c of the carrier 1100.

According to various embodiments, the vertical diode 1100d may be integrated into the carrier 1100 by the three layers 1100a, 1100b, and 1100c of the carrier 1100. The three layers 1100a, 1100b, and 1100c of the carrier 1100 may provide or may include three semiconducting regions 1102a, 1102b and 1103c providing a first pn-junction and a second pn-junction. By providing an electrical short 1109 (e.g. a metal bypass), as described herein, a vertical diode 1100d with only one pn-junction (provided by the semiconducting regions 1102b and 1103c) is provided in the carrier 1100.

According to various embodiments, the vertical diode 1100d may include an anode region 1102b and a cathode region 1102c. Further, the vertical thyristor 1100t may include an anode region 1101d and a cathode region 1101a and two base regions 1101b and 1101c between the anode region 1101d and the cathode region 1101a.

According to various embodiments, the anode region 1101d of the vertical thyristor 1100t and the cathode region 1102c of the vertical diode 1100d may be electrically coupled to a first terminal (e.g. at a front side of the carrier 1100). Further, the cathode region 1101a of the vertical thyristor 1100t and the anode region 1102b of the vertical diode 1100d may be electrically coupled to a second terminal (e.g. at a back side of the carrier 1100). The anode region 1102b of the vertical diode 1100d may be coupled to the second terminal via the electrical short 1109 and the n-type region 1102a.

According to various embodiments, an additional Zener diode may be integrated into the vertical thyristor 1100t, as already described herein, for example by forming an additional highly n-type doped region between the two base regions 1101b and 1101c of the vertical thyristor 1100t.

Analogously, the vertical diode 1100d and the vertical thyristor 1100t may be configured in the opposite doping scheme.

A vertically integrated semiconductor device in accordance with various embodiments may include: a first semiconducting layer; a second semiconducting layer disposed over the first semiconducting layer; a third semiconducting layer disposed over the second semiconducting layer; and an electrical short coupled between the first semiconducting layer and the second semiconducting layer.

In one or more embodiments, the first semiconducting layer and the second semiconducting layer may be of the same conductivity type.

In one or more embodiments, the first semiconducting layer and the second semiconducting layer may be of opposite conductivity type.

In one or more embodiments, the second semiconducting layer may be disposed directly on the first semiconducting layer.

In one or more embodiments, the electrical short may include electrically conductive material having a specific electrical resistivity of less than or equal to about 1 mΩ·cm (milliohm centimeters), e.g. measured at a temperature of about 20° C.

In one or more embodiments, the electrically conductive material may include or may be at least one of a metal or metal alloy.

In one or more embodiments, the metal or metal alloy may be selected from a group of materials, the group consisting of tungsten, copper, aluminum, an alloy including at least one of the aforementioned materials. In one or more embodiments, the metal or metal alloy may be selected from a group of materials, the group consisting of tungsten having a specific electrical resistivity (e.g. measured at a temperature of about 20° C.) of about $5.6 \cdot 10^{-3}$ mΩ·cm, copper having a specific electrical resistivity (e.g. measured at a temperature of about 20° C.) of about $1.7 \cdot 10^{-3}$ mΩ·cm, aluminum having a specific electrical resistivity (e.g. measured at a temperature of about 20° C.) of about $2.8 \cdot 10^{-3}$ mΩ·cm, an alloy including at least one of the aforementioned materials having a specific electrical resistivity in the range from about $1.6 \cdot 10^3$ mΩ·cm to about $1 \cdot 10^2$ mΩ·cm.

In one or more embodiments, the electrically conductive material may include doped polysilicon or may be doped polysilicon having a dopant concentration of greater than or equal to about $10^{20}$ cm$^{-3}$ (atoms per cm$^3$).

In one or more embodiments, the electrical short may include or may be a trench at least partially filled with the electrically conductive material.

In one or more embodiments, the electrical short may include or may be a metal plug.

In one or more embodiments, the trench may be adjacent to a sidewall of at least one of the first and second semiconducting layers.

In one or more embodiments, the trench may be adjacent to a sidewall of the first semiconducting layer and adjacent to a sidewall of the second semiconducting layer.

In one or more embodiments, the trench may be adjacent to a sidewall of the third semiconducting layer.

In one or more embodiments, an upper portion of at least one sidewall of the trench may be covered with insulating material.

In one or more embodiments, at least a portion of at least one sidewall of the trench may be covered with a liner.

In one or more embodiments, the liner may include or may be made of a metal, e.g. titanium and/or titanium nitride.

In one or more embodiments, the first semiconducting layer may be doped with a dopant concentration of greater than or equal to about $3 \cdot 10^{18}$ cm$^{-3}$ (atoms per cm$^3$) or $3 \cdot 10^{19}$ cm$^{-3}$ (atoms per cm$^3$), e.g. in the range from about $3 \cdot 10^{18}$ cm$^{-3}$ to about $1 \cdot 10^{20}$ cm$^{-3}$.

In one or more embodiments, the second semiconducting layer may be doped with a dopant concentration of greater than or equal to about $5 \cdot 10^{12}$ cm$^{-3}$ (atoms per cm$^3$) or $1 \cdot 10^{18}$ cm$^{-3}$ (atoms per cm$^3$), e.g. in the range from about $5 \cdot 10^{12}$ cm$^{-3}$ to about $1 \cdot 10^{19}$ cm$^{-3}$.

In one or more embodiments, the third semiconducting layer may be doped with a dopant concentration of greater than or equal to about $1 \cdot 10^{15}$ cm$^{-3}$ (atoms per cm$^3$), $1 \cdot 10^{16}$ cm$^{-3}$ (atoms per cm$^3$), $1 \cdot 10^{18}$ cm$^{-3}$ (atoms per cm$^3$), or $3 \cdot 10^{19}$ cm$^{-3}$ (atoms per cm$^3$), e.g. in the range from about $1 \cdot 10^{15}$ cm$^{-3}$ to about $5 \cdot 10^{19}$ cm$^{-3}$.

In one or more embodiments, the device may further include a fourth semiconducting layer disposed between the first semiconducting layer and the second semiconducting layer.

In one or more embodiments, the first, second and fourth semiconducting layers may be of the same conductivity type, and the fourth semiconducting layer may have a lower dopant concentration than at least one of the first and second semiconducting layers.

In one or more embodiments, the fourth semiconducting layer may be doped with a dopant concentration of greater than or equal to about $1 \cdot 10^{12}$ cm$^{-3}$ (atoms per cm$^3$) or $5 \cdot 10^{13}$ cm$^{-3}$ (atoms per cm$^3$), e.g. in the range from about $1 \cdot 10^{12}$ cm$^{-3}$ to about $1 \cdot 10^{19}$ cm$^{-3}$.

In one or more embodiments, the electrical short may include a metal layer disposed between the first semiconducting layer and the second semiconducting layer.

In one or more embodiments, the device may include a diode, wherein the second semiconducting layer includes an anode region of the diode and the third semiconducting layer includes a cathode region of the diode.

In one or more embodiments, the first and third semiconducting layers may be n-type semiconducting layers and the second semiconducting layer may be a p-type semiconducting layer.

In one or more embodiments, the device may include a thyristor, wherein the first semiconducting layer includes a cathode region of the thyristor, the second semiconducting layer includes a first base region of the thyristor, and the third semiconducting layer includes at least a portion of a second base region of the thyristor.

In one or more embodiments, the first semiconducting layer and the third semiconducting layer may be n-type semiconducting layers, and the second semiconducting layer may be a p-type layer semiconducting layer.

In one or more embodiments, the device may further include a p-type semiconducting layer disposed over the third semiconducting layer and including an anode region of the thyristor.

In one or more embodiments, the p-type semiconducting layer including the anode region of the thyristor may have a dopant concentration of less than or equal to about $1 \cdot 10^{21}$ cm$^{-3}$ (atoms per cm$^3$), e.g. in the range from about $3 \cdot 10^{18}$ cm$^{-3}$ to about $1 \cdot 10^{21}$ cm$^{-3}$.

In one or more embodiments, the p-type semiconducting layer may have a thickness in the range from about 0.1 μm to about 2 μm.

In one or more embodiments, the device may further include a fourth semiconducting layer disposed between the second semiconducting layer and the third semiconducting layer, the fourth semiconducting layer including at least a portion of the second base region of the thyristor.

In one or more embodiments, the first semiconducting layer may have a thickness in the range from about 5 μm to about 80 μm.

In one or more embodiments, the second semiconducting layer may have a thickness in the range from about 0.1 μm to about 10 μm.

In one or more embodiments, the third semiconducting layer may have a thickness in the range from about 0.1 μm to about 10 μm.

In one or more embodiments, the device may include a diode and a thyristor coupled in parallel to the diode, wherein the first semiconducting layer includes a cathode region of the thyristor, the second semiconducting layer includes an anode region of the diode and a first base region of the thyristor, and the third semiconducting layer includes a cathode region of the diode and at least a portion of a second base region of the thyristor.

In one or more embodiments, the device may further include a fourth semiconducting layer disposed between the second semiconducting layer and the third semiconducting layer, the fourth semiconducting layer including at least a portion of the second base region of the thyristor.

In one or more embodiments, the first semiconducting layer and the third semiconducting layer may be n-type semiconducting layers, and the second semiconducting layer may be a p-type layer semiconducting layer.

In one or more embodiments, the device may further include a p-type semiconducting layer disposed over the third semiconducting layer and including an anode region of the thyristor.

A vertically integrated semiconductor device in accordance with various embodiments may include: a first semiconducting layer; a second semiconducting layer disposed over the first semiconducting layer; a third semiconducting layer disposed over the second semiconducting layer; and an electrical bypass coupling the first semiconducting layer to the second semiconducting layer.

A vertically integrated semiconductor device in accordance with various embodiments may include: a thyristor; a diode coupled in parallel to the thyristor; an electrical short bypassing a pn-junction of at least one of the diode and the thyristor.

In one or more embodiments, the device may further include a substrate, wherein the electrical short is buried in the substrate.

In one or more embodiments, the electrical short may include a trench filled with electrically conductive material.

In one or more embodiments, the electrically conductive material may include or may be at least one of a metal or metal alloy.

In one or more embodiments, the device may further include a first semiconducting layer including a cathode region of the thyristor, a second semiconducting layer disposed over the first semiconducting layer and including an anode region of the diode and a first base region of the thyristor, and a third semiconducting layer including a cathode region of the diode and at least a portion of a second base region of the thyristor, wherein the electrical short bypasses a pn-junction between the first semiconducting layer and the second semiconducting layer.

A vertically integrated semiconductor device in accordance with various embodiments may include: two (e.g. buried) low-ohmic semiconducting layers disposed over each other, wherein the two low-ohmic semiconducting layers have no common interface; a (e.g. buried) high-ohmic semiconducting layer disposed between the two low-ohmic semiconducting layers; an electrical bypass coupling the two low-ohmic semiconducting layers to one another and bridging the high-ohmic semiconducting layer. In one or more embodiments, the two low-ohmic semiconducting layers may be doped with a dopant concentration of greater than or equal to $10^{18}$ cm$^{-3}$, and the high-ohmic semiconducting layer may be doped with a dopant concentration of less than $10^{18}$ cm$^{-3}$. In one or more embodiments, the two low-ohmic semiconducting layers may be doped with a dopant concentration of greater than or equal to $10^{19}$ cm$^{-3}$, and the high-ohmic semiconducting layer may be doped with a dopant concentration of less than $10^{19}$ cm$^{-3}$. In one or more embodiments, the two low-ohmic semiconducting layers may be doped with a dopant concentration of greater than or equal to $10^{20}$ cm$^{-3}$, and the high-ohmic semiconducting layer may be doped with a dopant concentration of less than $10^{20}$ cm$^{-3}$. In one or more embodiments, the two low-ohmic semiconducting layers may have a specific electrical resistivity less than 1 mΩ·cm, and the high-ohmic semiconducting layer may have a specific electrical resistivity of greater than 1 mΩ·cm.

In one or more embodiments, the electrical bypass may include or may be a metal plug.

A method of manufacturing a vertically integrated semiconductor device in accordance with various embodiments may include: forming a second semiconducting layer over a first semiconducting layer; forming a third semiconducting layer over the second semiconducting layer; forming a trench that reaches through the second and third semiconducting layers to the first semiconducting layer; depositing electrically conductive material into the trench, wherein the electrically conductive material in the trench forms an electrical short between the first and second semiconducting layers.

In one or more embodiments, forming the trench may include: forming the trench to a first depth such that the trench reaches through the third semiconducting layer to the second semiconducting layer; covering a sidewall or sidewalls of the trench with electrically insulating material; subsequently extending the trench to a second depth such that the extended trench reaches through the second semiconducting layer to the first semiconducting layer.

In one or more embodiments, forming the trench may include: forming the trench to a first depth such that the trench reaches through the third semiconducting layer to the second semiconducting layer; covering a sidewall or sidewalls of the trench with a material including a dopant, diffusing the dopant from the material into the third semiconducting layer; and subsequently extending the trench to a second depth such that the extended trench reaches through the second semiconducting layer to the first semiconducting layer.

In one or more embodiments, the electrically insulating material may include or may be borosilicate glass.

In one or more embodiments, forming the trench may include etching at least the second and third semiconducting layers.

In one or more embodiments, forming the trench may include etching the first, second and third semiconducting layers.

In one or more embodiments, the electrically conductive material may include or may be at least one of a metal or metal alloy.

In one or more embodiments, forming the second semiconducting layer may include epitaxially growing the second semiconducting layer.

In one or more embodiments, forming the third semiconductor layer may include epitaxially growing the third semiconductor layer.

A vertically integrated semiconductor device in accordance with various embodiments may include: a vertical thyristor including a first pn-junction and a second pn-junction provided by three semiconducting layers; a vertical diode structure including a third pn-junction and a fourth pn-junction provided by the three semiconducting layers, and an electrical bypass bypassing at least one of the second pn-junction of the vertical thyristor or the fourth pn-junction of the vertical diode structure.

A vertically integrated semiconductor device in accordance with various embodiments may include: two low-ohmic semiconducting layers disposed over each other, a high-ohmic semiconducting layer disposed between the two low-ohmic semiconducting layers, wherein the high-ohmic semiconducting layer separates the two low-ohmic semiconducting layers from each other; and an electrical bypass coupling the two low-ohmic semiconducting layers to one another and bridging the high-ohmic semiconducting layer.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method of manufacturing a vertically integrated semiconductor device, the method comprising:
   forming a second semiconducting layer over a first semiconducting layer;
   forming a third semiconducting layer over the second semiconducting layer; and
   forming an electrical short between the first and second semiconducting layers,
   wherein forming the electrical short comprises:

forming at least one trench extending through the third and second semiconductor layers and partially through the first semiconductor layer;

providing an electrically insulating material in the at least one trench covering the sidewalls of the third semiconductor layer and partially covering the sidewalls of the second semiconductor layer; and depositing electrically conductive material into the at least one trench, wherein the electrically conductive material completely fills the at least one trench and wherein the electrically conductive material in the at least one trench provides the electrical short between the first and second semiconducting layers and wherein the electrically insulating material in the at least one trench is disposed so that the electrically conductive material in the at least one trench does not provide an electrical short between the second and third semiconductor layers.

2. The method of claim 1, wherein forming the at least one trench comprises:

forming a patterned mask layer over the third semiconductor layer, the patterned mask defining a position of the at least one trench, and etching to remove material from the first, second, and third semiconductor layers.

3. The method of claim 1, wherein the first and second semiconducting layers are oppositely doped semiconducting layers forming a pn-junction.

4. The method of claim 1, wherein the electrically conductive material has a specific electrical resistivity of less than or equal to 1 mΩ·cm.

5. The method of claim 1, wherein the electrically insulating material comprises dopant source material.

6. The method of claim 1, wherein the electrically insulating material comprises borophosphosilicate glass.

7. The method of claim 1, wherein the electrically insulating material comprises an oxide layer.

8. The method of claim 1, wherein forming the electrical short further comprises:

forming a first portion of the at least one trench extending through the third semiconductor layer and partially through the second semiconductor layer;

providing the electrically insulating material in the first portion of the at least one trench covering the sidewalls of the third semiconductor layer and partially covering the sidewalls of the second semiconductor layer; and forming a second portion of the at least one trench extending through the remainder of the second semiconductor layer and partially through the first semiconductor layer.

9. The method of claim 1, wherein providing the electrically insulating material into the at least one trench comprises performing a conformal deposition process.

10. The method of claim 9, wherein the conformal deposition process deposits the electrically insulating material only on one or more sidewalls of the trench.

11. The method of claim 9, wherein the conformal deposition process comprises plating process, an atomic layer deposition (ALD) process, or a chemical vapor deposition (CVD) process.

12. A method for manufacturing a semiconductor device, the method comprising:

providing a carrier;

forming a trench from a surface of the carrier into the carrier, the trench bridging a buried pn-junction disposed within the carrier;

providing a buried pn-short in the trench, the buried pn-short electrically bypassing the buried pn-junction;

covering the buried pn-short with an insulating layer; and, providing one or more electrical connections to the carrier.

13. The method of claim 12, wherein the buried pn-junction is a first buried pn-junction, and wherein the carrier further comprises a second buried pn-junction.

14. The method of claim 13, wherein the carrier comprises an isolation trench, wherein the isolation trench electrically separates the second buried pn-junction from the buried pn-short so that the second pn-junction is not electrically bypassed by the buried pn-short.

15. The method of claim 12, wherein the carrier comprises a semiconductor wafer and wherein forming the trench comprises:

depositing an electrically insulating layer over a front side of the wafer, patterning the electrically insulating layer, and etching the trench into the wafer from the front side of the wafer.

16. The method of claim 15, wherein providing the buried pn-short comprises:

depositing a metal over the front side of the wafer, wherein depositing the metal over the front side of the wafer at least partially fills the trench with the metal, and removing deposited metal from the entire front side of the wafer, wherein the metal in the trench remains.

17. The method of claim 16, further comprising:

after providing the buried pn-short and before providing electrical connections:

depositing an insulating layer on the front side of the carrier, the insulating layer covering the metal remaining in the trench, and planarizing the carrier from the front side.

18. The method of claim 15, wherein the electrically insulating layer is an oxide layer.

* * * * *